(12) United States Patent
Sasaki et al.

(10) Patent No.: US 8,574,972 B2
(45) Date of Patent: Nov. 5, 2013

(54) METHOD FOR FABRICATING SEMICONDUCTOR DEVICE AND PLASMA DOPING APPARATUS

(75) Inventors: Yuichiro Sasaki, Nara (JP); Masafumi Kubota, Osaka (JP); Shigenori Hayashi, Nara (JP)

(73) Assignee: Panasonic Corporation, Osaka (JP)

( * ) Notice: Subject to any disclaimer, the term of this patent is extended or adjusted under 35 U.S.C. 154(b) by 77 days.

(21) Appl. No.: 13/264,660

(22) PCT Filed: Oct. 28, 2010

(86) PCT No.: PCT/JP2010/006379
§ 371 (c)(1),
(2), (4) Date: Oct. 14, 2011

(87) PCT Pub. No.: WO2011/080857
PCT Pub. Date: Jul. 7, 2011

(65) Prior Publication Data
US 2012/0034750 A1    Feb. 9, 2012

(30) Foreign Application Priority Data
Dec. 28, 2009    (JP) .................. 2009-297063

(51) Int. Cl.
*H01L 21/00*    (2006.01)
(52) U.S. Cl.
USPC .................. 438/165; 257/E21.564
(58) Field of Classification Search
USPC .......... 438/164, 513, 165; 257/E21.564
See application file for complete search history.

(56) References Cited

U.S. PATENT DOCUMENTS

| | | | |
|---|---|---|---|
| 4,912,065 A | 3/1990 | Mizuno et al. | |
| 4,937,205 A | 6/1990 | Nakayama et al. | |
| 5,804,471 A | 9/1998 | Yamazaki et al. | |
| 7,351,622 B2 * | 4/2008 | Buh et al. .................. | 438/157 |
| 2004/0099903 A1 | 5/2004 | Yeo et al. | |
| 2004/0235281 A1 | 11/2004 | Downey et al. | |
| 2006/0157749 A1 | 7/2006 | Okuno | |
| 2007/0042578 A1 | 2/2007 | Sasaki et al. | |
| 2007/0166846 A1 | 7/2007 | Sasaki et al. | |
| 2008/0050897 A1 | 2/2008 | Kottantharayil | |
| 2008/0179683 A1 | 7/2008 | Sasaki et al. | |

(Continued)

FOREIGN PATENT DOCUMENTS

| | | |
|---|---|---|
| JP | 01-295416 A | 11/1989 |
| JP | 06-260436 A | 9/1994 |

(Continued)

OTHER PUBLICATIONS

Lenoble, et al. "Enhanced performance of PMOS MUGFET via integration of conformal plasma-doped source/drain extensions." 2006 Symposium on VSLI Technology. Digest of Technical Paper,. (2006), pp. 168-169.

(Continued)

*Primary Examiner* — Quoc Hoang
(74) *Attorney, Agent, or Firm* — McDermott Will & Emery LLP

(57) ABSTRACT

After a fin-semiconductor region (13) is formed on a substrate (11), impurity-containing gas and oxygen-containing gas are used to perform plasma doping on the fin-semiconductor region (13). This forms impurity-doped region (17) in at least side portions of the fin-semiconductor region (13).

24 Claims, 11 Drawing Sheets

(56) References Cited

U.S. PATENT DOCUMENTS

| | | |
|---|---|---|
| 2009/0026540 A1 | 1/2009 | Sasaki et al. |
| 2009/0289300 A1 | 11/2009 | Sasaki et al. |
| 2010/0095889 A1 | 4/2010 | Kai et al. |
| 2011/0049628 A1 | 3/2011 | Okumura et al. |
| 2011/0151652 A1 | 6/2011 | Sasaki et al. |

FOREIGN PATENT DOCUMENTS

| | | |
|---|---|---|
| JP | 2006-196821 A | 7/2006 |
| JP | 2007-535174 A | 11/2007 |
| JP | 2008-053725 A | 3/2008 |
| JP | 2010-050188 A | 3/2010 |
| JP | 4598886 B1 | 10/2010 |
| WO | WO 2005/036626 A1 | 4/2005 |
| WO | WO 2006/064772 A1 | 6/2006 |
| WO | WO 2008/090771 A1 | 7/2008 |
| WO | WO 2009/016778 A1 | 2/2009 |
| WO | WO 2010/092748 A1 | 8/2010 |

OTHER PUBLICATIONS

International Search Report issued PCT Application No. PCT/JP2010/006379, dated Feb. 1, 2011.
Copending U.S. Appl. No. 12/866,649, filed Aug. 6, 2010.
Quirk, Michael, Semiconductor manufacturing technology,. 2001, Prentice Hall, p. 35.

* cited by examiner (a)

(b)

(c)

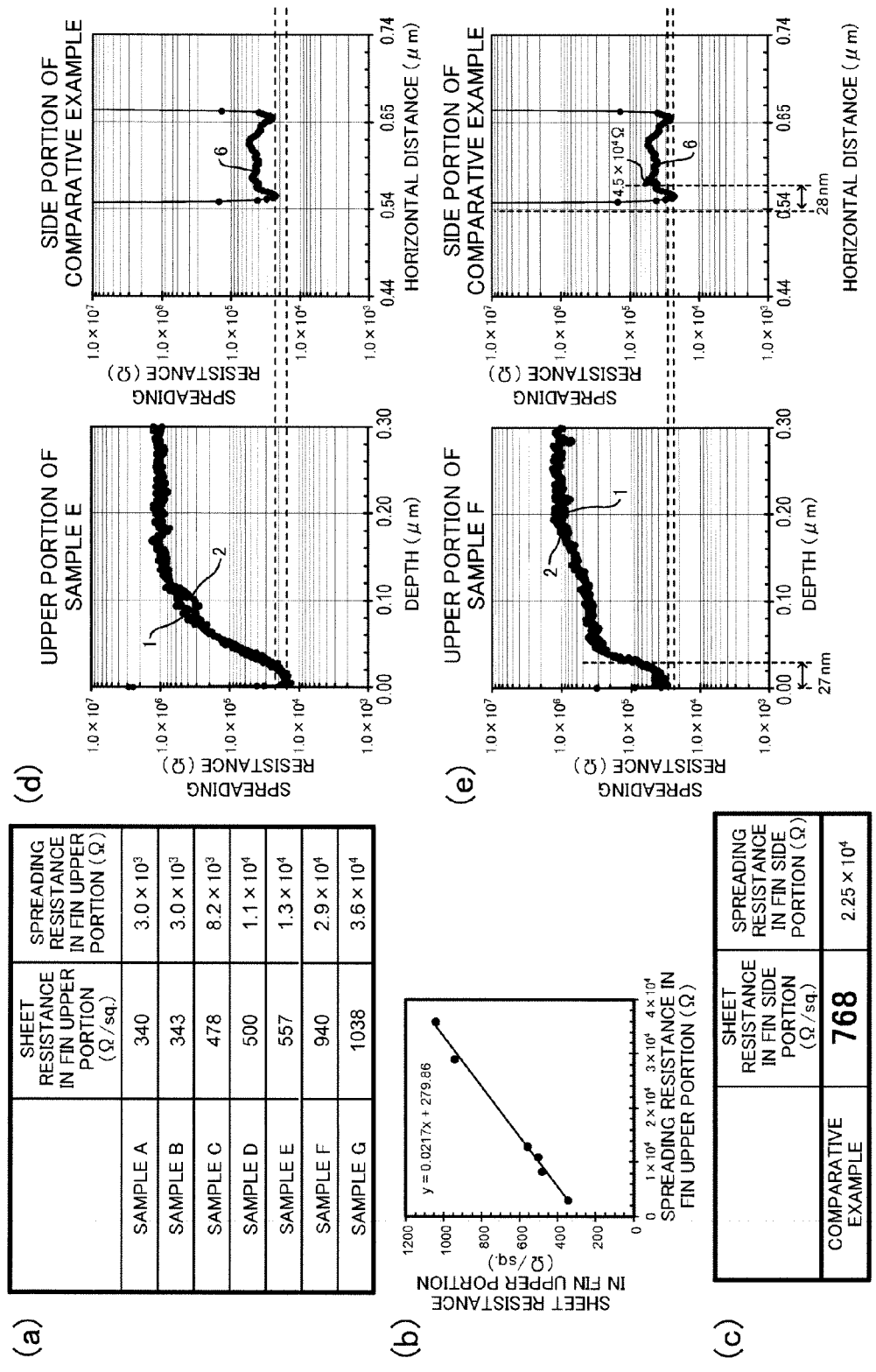

METHOD FOR FABRICATING SEMICONDUCTOR DEVICE AND PLASMA DOPING APPARATUS

RELATED APPLICATIONS

This application is the U.S. National Phase under 35 U.S.C. §371 of International Application No. PCT/JP2010/006379, filed on Oct. 28, 2010, which in turn claims the benefit of Japanese Application No. 2009-297063, filed on Dec. 28, 2009, the disclosures of which Applications are incorporated by reference herein.

TECHNICAL FIELD

The present invention relates to a method for fabricating a semiconductor device and a plasma doping apparatus, and particularly relates to a method for fabricating a semiconductor device of a three-dimensional structure having a fin-type semiconductor region on a substrate.

BACKGROUND ART

In recent years, as semiconductor devices have become higher in integration, functionality, and speed, demand for miniaturization of the semiconductor devices has been growing. Various device structures have been proposed for reducing an area occupied by transistors over a substrate. Among them, a field effect transistor having a fin-type structure has drawn attention. The field effect transistor having the fin-type structure is generally called a "fin-FET (fin-field effect transistor)," and has an active region made of a semiconductor region (hereinafter referred to as a fin-semiconductor region) having a thin-wall (fin) shape perpendicular to a principal surface of a substrate. In the fin-FET, side surfaces of the fin-semiconductor region can be used as channel surfaces, and therefore the area occupied by the transistors over the substrate can be reduced (see, e.g., Patent Document 1 and Non-Patent Document 1).

Patent Document 1 has proposed a technique by which ion is implanted to a fin-type silicon region in an oblique direction to form an extension region and a high-concentration impurity region as a source/drain region. The ion implantation in the oblique direction allows ion implantation to side portions of the fin-type silicon region in one direction, and ion implantation to an upper portion of the fin-type silicon region in two directions, e.g., when the impurity region is formed. Thus, an ion implantation dose amount in the impurity region of the upper portion of the fin-type silicon region is twice as much as that in the impurity region of the side portions of the fin-type silicon region. In other words, it is difficult to form a low-resistance impurity region in the side portions of the fin-type silicon region.

In recent years, attention has been drawn to plasma doping in order to dope the side surface of the fin-semiconductor region with an impurity.

Non-Patent Document 1 has proposed a pulse DC plasma technique as a plasma doping technique for forming an impurity region of a fin-FET. In the pulse DC plasma technique, plasma is intermittently generated, thereby realizing an advantage that etching of a fin-semiconductor region can be reduced.

As the plasma doping technique for forming the impurity region of the fin-FET, Patent Document 2 has proposed a plasma doping technique using an inductively-coupled plasma (ICP) method. In the ICP method, a relatively-long time domain (doping time) is used as compared to the pulse DC plasma technique, thereby realizing an advantage that doping can be uniformly performed in a surface of a large substrate such as a wafer having a diameter of 300 mm.

Although a plasma doping technique disclosed in Patent Document 3 is not intended to perform plasma doping on side surfaces of a fine narrow fin-semiconductor region, Patent Document 3 has disclosed a plasma doping technique for performing doping on side surfaces of a trench.

CITATION LIST

Patent Document

PATENT DOCUMENT 1: Japanese Patent Publication No. 2006-196821
PATENT DOCUMENT 2: International Publication No. 2006/064772
PATENT DOCUMENT 3: Japanese Patent Publication No. H01-295416
NON-PATENT DOCUMENT 1: D. Lenoble et. al., Enhanced Performance of PMOS MUGFET via Integration of Conformal Plasma-Doped Source/Drain Extensions, 2006 Symposium on VLSI Technology Digest of Technical Papers, p. 212

SUMMARY OF THE INVENTION

Technical Problem

As described above, various plasma doping techniques have been proposed in order to dope the side surfaces of the fin-semiconductor region with the impurity.

However, if an impurity such as arsenic (As) is introduced to the side surfaces of the fine fin-semiconductor region, adsorption of the impurity (particularly an N-type impurity) to the semiconductor is not enough, and therefore the low-resistance impurity region cannot be formed in side portions of the fin-semiconductor region. As a result, there is a problem that a fin-FET having desired properties cannot be obtained.

Note that, as will be described later, it is difficult that the technique for performing the doping on the side surfaces of the large-size trench as disclosed in Patent Document 3 is applied to form the impurity region of the fin-FET. That is, in the plasma doping technique for the side surfaces of the trench, technical problems critical in forming the fin-FET, i.e., amorphizing of the fin-semiconductor region, chipping of an upper corner of the fin-semiconductor region, etc. are not taken into consideration at all. Thus, a problem that crystal restoration after annealing is difficult due to amorphizing of a most part of the fin-semiconductor region or a problem that the upper corner of the fin-semiconductor region is chipped off over a large area is caused. As a result, even if the plasma doping technique for the side surfaces of the trench is diverted to introduce the impurity to the side portions of the fine narrow fin-semiconductor region and to electrically activate the impurity by the annealing, the low-resistance impurity region cannot be formed.

In the view of the foregoing, it is an objective of the present invention to form a low-resistance impurity region by introducing an impurity to side surfaces of a fin-semiconductor region, thereby realizing a fin-type semiconductor device having desired properties.

Solution to the Problem

In order to achieve the foregoing objective, the inventors of the present invention have conducted various studies, and have obtained the following findings.

Typically, it is preferred that oxygen is not contained in gas used for plasma doping on a fin-semiconductor region with an impurity. This is because oxidation of a semiconductor forming the fin-semiconductor region or the introduced impurity is prevented, and, as a result, an increase in resistance in an impurity region (e.g., an extension region) formed in the fin-semiconductor region is prevented.

However, the studies conducted by the inventors have showed unexpected results, i.e., resistance in an impurity region formed in a side portion of the fin-semiconductor region is lower in a case where the plasma doping with the impurity is performed in atmosphere containing a slight amount of oxygen as compared to a case where the plasma doping with the impurity is performed in atmosphere which does not contain oxygen at all.

This is because a semiconductor surface to which the impurity is adhered is covered by a thin oxide layer, thereby reducing outward diffusion of impurity having poor adsorption in activation heat treatment etc. Note that the oxide layer may be removed by, e.g., cleaning at a subsequent step.

In addition, other reason why the foregoing advantage can be obtained by adding oxygen in the plasma doping with the impurity is as follows.

When oxidation of silicon (Si) crystal is caused in high-temperature oxidative atmosphere, interstitial Si is increased in the Si crystal, thereby causing a phenomenon called "oxidation enhanced diffusion (OED)." Specifically, in a state of thermal equilibrium, there is a point defect (vacancy or interstitial Si) in the Si crystal in which thermal diffusion is caused at high temperature, and volume expansion is caused in the oxidative atmosphere when Si is altered to $SiO_2$ due to the oxidation. Occurrence of strain due to the volume expansion or occurrence of strain due to precipitation of oxygen contained in the Si crystal in large amounts at high temperature causes release of Si from the Si crystal, resulting in occurrence of interstitial Si.

Factors for interrupting activation of an impurity contained in the Si crystal, such as arsenic (As) includes, e.g., formation of a complex of As and vacancies in Si. Such a complex is particularly likely to be formed when an As concentration is high, and As forming the complex is changed into electrically-inactivate As which does not work as an N-type donor. Sheet resistance of an As diffusion layer having a large number of the complexes is increased.

Typically, a complex of a single As atom and several vacancies is considered as a stable complex of As and vacancies. However, since such a complex has a large volume, the thermal diffusion is not easily caused. Thus, a coefficient of diffusion may be reduced.

On the other hand, when vacancies and interstitial Si are bonded together, both of the vacancies and the interstitial Si are disappeared. Thus, more interstitial Si results in a decrease in vacancy density and a decrease in opportunity to form the complex of As and vacancies. As a result, an activation rate of As is improved.

As described above, the oxygen addition in the plasma doping with the impurity results in an increase in interstitial Si in the Si crystal. Thus, the activation of the impurity is accelerated in the activation heat treatment etc. which are subsequent steps, thereby reducing the resistance in the impurity region.

The present invention has been made in view of the foregoing findings, and includes the steps of (a) forming a fin-semiconductor region on a substrate; and (b) performing plasma doping on the fin-semiconductor region by using impurity-containing gas and oxygen-containing gas, thereby forming an impurity-doped region in at least side portions of the fin-semiconductor region.

Note that, in the present application, an impurity contained in the impurity-containing gas and introduced to the semiconductor to form the impurity-doped region means an impurity producing a donor level or an acceptor level in the semiconductor, i.e., an N-type or P-type impurity.

According to the semiconductor device fabricating method of the present invention, the impurity-containing gas and the oxygen-containing gas are used when the impurity is introduced to the side portions of the fin-semiconductor region by the plasma doping. Thus, the resistance in the impurity-doped region formed in the side portion of the fin-semiconductor region can be reduced as compared to the case where the plasma doping with the impurity is performed in the atmosphere which does not contain oxygen at all. Consequently, a fin-type semiconductor device having desired properties can be realized. In particular, when an N-type impurity having poor adsorption to the semiconductor is introduced as the impurity by the plasma doping, the foregoing advantage can be remarkably obtained as compared to the prior art.

In the semiconductor device fabricating method of the present invention, at step (b), after the impurity-containing gas and the oxygen-containing gas are mixed together, a gas mixture may be supplied to a chamber in which the substrate is mounted and may be used to generate plasma. Alternatively, at step (b), after the impurity-containing gas and the oxygen-containing gas are separately supplied to a chamber in which the substrate is mounted and are mixed together, a gas mixture may be used to generate plasma. In such a manner, safety when the plasma doping is performed is improved.

In the semiconductor device fabricating method of the present invention, at step (b), after the oxygen-containing gas is used to perform first plasma doping on the fin-semiconductor region, the impurity-containing gas may be used to perform second plasma doping on the fin-semiconductor region, thereby forming the impurity-doped region in the side portions of the fin-semiconductor region. Alternatively, at step (b), after the impurity-containing gas is used to perform first plasma doping on the fin-semiconductor region and the impurity-doped region is formed in the side portions of the fin-semiconductor region, the oxygen-containing gas may be used to perform second plasma doping on the fin-semiconductor region. In such cases, the first plasma doping and the second plasma doping may be performed in the same chamber, or the first plasma doping and the second plasma doping may be performed in different chambers.

In the semiconductor device fabricating method of the present invention, the impurity-containing gas may be $AsH_3$. Alternatively, instead of arsenic-containing (As-containing) gas such as $AsH_3$, e.g., gas containing phosphorus (P) may be used as the impurity-containing gas.

In the semiconductor device fabricating method of the present invention, the impurity-containing gas may be diluted with dilution gas. In such a case, the dilution gas may be He. Alternatively, instead of He, e.g., hydrogen ($H_2$) or neon (Ne) may be used as the dilution gas.

In the semiconductor device fabricating method of the present invention, the oxygen-containing gas may be at least one of $O_2$, $H_2O$, $N_2O$, or $CO_2$.

In the semiconductor device fabricating method of the present invention, the oxygen-containing gas may be diluted with dilution gas. In such a case, the dilution gas may be He. Alternatively, instead of He, e.g., hydrogen ($H_2$) or neon (Ne) may be used as the dilution gas.

The semiconductor device fabricating method of the present invention may further include the step of, after step (a) and before step (b), forming a gate electrode so as to cover part of the fin-semiconductor region adjacent to the impurity-doped region. The impurity-doped region may be an extension region.

The semiconductor device fabricating method of the present invention may further include the steps of, after step (a) and before step (b), forming a gate electrode so as to cover part of the fin-semiconductor region apart from the impurity-doped region, and forming an insulating sidewall-spacer so as to cover part of the fin-semiconductor region positioned between the impurity-doped region and the gate electrode and cover a side surface of the gate electrode. The impurity-doped region may be a source/drain region.

The semiconductor device fabricating method of the present invention may further include the step of, after step (b), performing activation heat treatment on the impurity-doped region.

A first plasma doping apparatus of the present invention is a plasma doping apparatus for introducing an impurity to a semiconductor by plasma doping, which includes a chamber in which plasma is generated; and a gas supply section for supplying impurity-containing gas and oxygen-containing gas to the chamber. The gas supply section controls an amount of the oxygen-containing gas to be supplied.

According to the first plasma doping apparatus, the impurity-containing gas and the oxygen-containing gas can be together used when the impurity is introduced to the side portions of the fin-semiconductor region by the plasma doping. Thus, the resistance in the impurity-doped region formed in the side portion of the fin-semiconductor region can be reduced as compared to the case where the plasma doping with the impurity is performed in the atmosphere which does not contain oxygen at all. Consequently, the fin-type semiconductor device having desired properties can be realized. In particular, when the N-type impurity having poor adsorption to the semiconductor is introduced as the impurity by the plasma doping, the foregoing advantage can be remarkably obtained as compared to the prior art.

In the first plasma doping apparatus of the present invention, the gas supply section may mix the impurity-containing gas and the oxygen-containing gas together, and supply a gas mixture to the chamber. Alternatively, the gas supply section may separately supply the impurity-containing gas and the oxygen-containing gas to the chamber, and the impurity-containing gas and the oxygen-containing gas may be mixed together in the chamber. In such a manner, the safety when the plasma doping is performed is improved.

In the first plasma doping apparatus of the present invention, the gas supply section may be provided for each of a middle portion and a peripheral portion of an object to be processed, which is mounted in the chamber. In such a manner, the plasma doping can be performed with good uniformity.

The first plasma doping apparatus of the present invention may further include a monitoring section for measuring an oxygen concentration in the plasma. In such a manner, the plasma doping can be performed with good controllability.

In the first plasma doping apparatus of the present invention, the gas supply section may supply the impurity-containing gas diluted with dilution gas.

In the first plasma doping apparatus of the present invention, the gas supply section may supply the oxygen-containing gas diluted with dilution gas.

A second plasma doping apparatus of the present invention is a plasma doping apparatus for introducing an impurity to a semiconductor by plasma doping, which includes a first chamber in which first plasma is generated; a second chamber in which second plasma is generated; a first gas supply section for supplying impurity-containing gas to the first chamber; and a second gas supply section for supplying oxygen-containing gas to the second chamber. The second gas supply section controls an amount of the oxygen-containing gas to be supplied.

According to the second plasma doping apparatus of the present invention, after the oxygen-containing gas is used to perform the first plasma doping, the impurity-containing gas can be used to perform the second plasma doping. Alternatively, after the impurity-containing gas is used to perform the first plasma doping, the oxygen-containing gas can be used to perform the second plasma doping. Thus, the resistance in the impurity-doped region formed in the side portion of the fin-semiconductor region can be reduced as compared to the case where the plasma doping with the impurity is performed in the atmosphere which does not contain oxygen at all. Consequently, the fin-type semiconductor device having desired properties can be realized. In particular, when the N-type impurity having poor adsorption to the semiconductor is introduced as the impurity by the plasma doping, the foregoing advantage can be remarkably obtained as compared to the prior art.

In the second plasma doping apparatus of the present invention, the first gas supply section may be provided for each of a middle portion and a peripheral portion of an object to be processed, which is mounted in the first chamber. In such a manner, the plasma doping can be performed with good uniformity.

In the second plasma doping apparatus of the present invention, the second gas supply section may be provided for each of a middle portion and a peripheral portion of an object to be processed, which is mounted in the second chamber. In such a manner, the plasma doping can be performed with good uniformity.

The second plasma doping apparatus of the present invention may further include a monitoring section for measuring an oxygen concentration in the second plasma. In such a manner, the plasma doping can be performed with good controllability.

In the second plasma doping apparatus of the present invention, the first gas supply section may supply the impurity-containing gas diluted with dilution gas.

In the second plasma doping apparatus of the present invention, the second gas supply section may supply the oxygen-containing gas diluted with dilution gas.

Advantages of the Invention

According to the present invention, since the low-resistance impurity region can be formed by introducing the impurity to the side surface of the fin-semiconductor region, the fin-type semiconductor device having desired properties can be realized.

BRIEF DESCRIPTION OF THE DRAWINGS

FIG. 2(a) is a plan view. FIG. 2(b) is a cross-sectional view along an A-A line of FIG. 2(a). FIG. 2(c) is a cross-sectional view along a B-B line of FIG. 2(a).

FIG. 11(a) is a table illustrating values for sheet resistance and spreading resistance in the upper portion of the fin-semiconductor region, which are obtained by introducing an impurity under various plasma doping conditions for a plurality of samples. FIG. 11(b) is a graph illustrating a correlation relationship between the sheet resistance and the spreading resistance illustrated in FIG. 11(a). FIG. 11(c) is a table illustrating a result obtained by converting the spreading resistance in the side portion of the fin-semiconductor region of the comparative example into the sheet resistance based on the correlation relationship illustrated in FIG. 11(b). FIG. 11(d) is a graph illustrating the relationship between the horizontal distance and the spreading resistance in the side portion of the fin-semiconductor region of the comparative example as compared to a relationship between a depth and spreading resistance in an upper portion of a fin-semiconductor region of one of the samples. FIG. 11(e) is a graph illustrating the relationship between the horizontal distance and the spreading resistance in the side portion of the fin-semiconductor region of the comparative example as compared to a relationship between a depth and spreading resistance in an upper portion of a fin-semiconductor region of another sample.

DESCRIPTION OF EMBODIMENTS

Embodiment

A semiconductor device fabricating method of an embodiment and a plasma doping apparatus used in the fabricating method will be together described below with reference to the drawings.

FIGS. 1(a)-1(g) are cross-sectional views illustrating steps in the semiconductor device fabricating method of the present embodiment.

Figure 1:
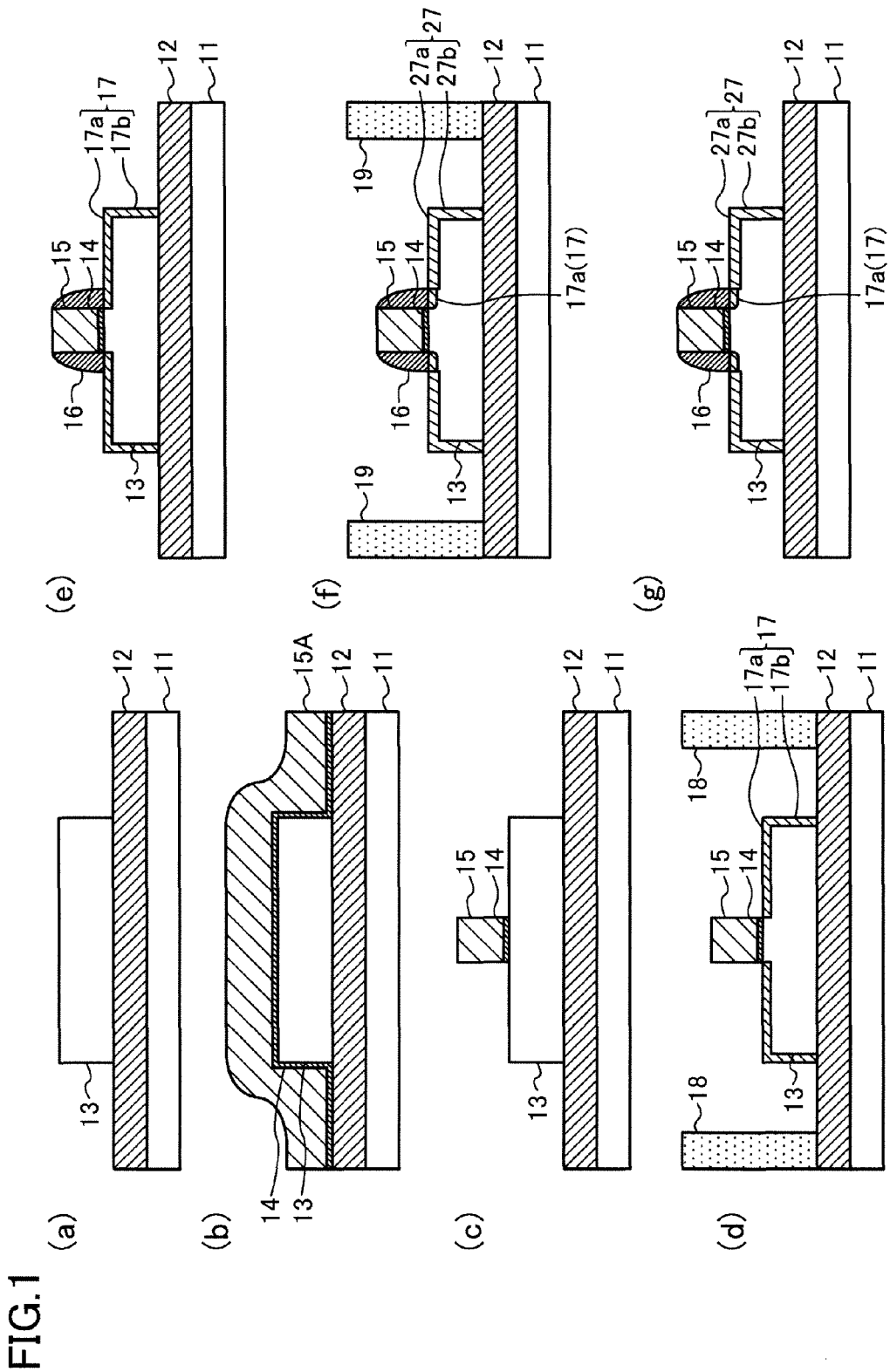
FIGS. 1(a)-1(g) are cross-sectional views illustrating steps in a semiconductor device fabricating method of an embodiment.

First, as illustrated in FIG. 1(a), a semiconductor-on-insulator (SOI) substrate is prepared, in which an insulating layer 12 made of, e.g., silicon oxide and having a thickness of 150 nm is provided on a support substrate 11 made of, e.g., silicon and having a thickness of 800 μm, and a semiconductor layer made of, e.g., silicon and having a thickness of 50 nm is provided on the insulating layer 12. Subsequently, the semiconductor layer is patterned, thereby forming a p-type fin-semiconductor region 13 which will be an active region. A width (a) of the fin-semiconductor region 13 in a gate width direction is, e.g., equal to or greater than 5 nm and equal to or less than 15 nm, a width (b) of the fin-semiconductor region 13 in a gate length direction is, e.g., about 200 nm, a height (thickness) (c) of the fin-semiconductor region 13 is, e.g., about 50 nm, and a pitch (d) of the fin-semiconductor regions 13 is, e.g., equal to or less than about twice the width (a) (see FIG. 2(a)).

Next, as illustrated in FIG. 1(b), a gate insulating film 14 made of, e.g., a silicon oxynitride film and having a thickness of 3 nm is formed on a surface of the fin-semiconductor region 13, and then a polysilicon film 15A having a thickness of, e.g., 60 nm is formed across an entire surface of the support substrate 11.

Next, as illustrated in FIG. 1(c), the polysilicon film 15A and the gate insulating film 14 are successively etched, thereby forming a gate electrode 15 having a width of, e.g., 20 nm in the gate length direction on the fin-semiconductor region 13 with the gate insulating film 14 being interposed between the gate electrode 15 and the fin-semiconductor region 13.

Next, as illustrated in FIG. 1(d), by using a resist pattern 18 through which the fin-semiconductor region 13 is exposed and the gate electrode 15 as a mask, an impurity is introduced to an upper potion and side portions of the fin-semiconductor region 13 by plasma doping, and then a first N-type impurity region 17a and a second N-type impurity region 17b which form an extension region 17 are formed in the upper portion and the side portions of the fin-semiconductor region 13, respectively. At this point, conditions for the plasma doping are, e.g., as follows: material gas is $AsH_3$ (arsine) diluted with He (helium); an $AsH_3$ concentration in the material gas is 0.5% by mass; an $AsH_3$ flow rate is 0.12 cm$^3$/minute (standard state); a total flow rate of the material gas is 475 cm³/minute (standard state); a pressure in a chamber is 0.5 Pa; source power (high-frequency power for plasma generation) is 500 W; bias voltage (Vpp) is 250 V; a substrate temperature is 22° C.; and a plasma doping time is 60 seconds.

As a feature of the present embodiment, in the plasma doping for forming the extension region 17, $AsH_3$ which is impurity-containing gas is used, as well as a slight amount of oxygen ($O_2$) gas diluted with He is used as oxygen-containing gas. An $O_2$ concentration in an $O_2$/He gas mixture is, e.g., 1.0% by mass. An $O_2$ flow rate is, e.g., 0.0166 cm³/minute (standard state), and a total flow rate of the $O_2$/He gas mixture is, e.g., 13.2 cm³/minute (standard state). This suppresses spreading resistance in the second N-type impurity region 17b which corresponds to the extension region 17 in the side portion of the fin-semiconductor region 13 to about $9.09 \times 10^3 \Omega$.

Next, the resist pattern 18 is removed by, e.g., cleaning, and then an insulating film having a thickness of, e.g., 60 nm is formed across the entire surface of the support substrate 11. Subsequently, the insulating film is etched back by using anisotropic dry etching. In such a manner, as illustrated in FIG. 1(e), an insulating sidewall-spacer 16 is formed on a side surface of the gate electrode 15.

Next, as illustrated in FIG. 1(f), by using a resist pattern 19 through which the fin-semiconductor region 13 is exposed, the gate electrode 15, and the insulating sidewall-spacer 16 as a mask, an impurity is introduced to the upper portion and the side portions of the fin-semiconductor region 13 by the plasma doping, and then a third N-type impurity region 27a and a fourth N-type impurity region 27b which form a source/drain region 27 are formed in the upper portion and the side portions of the fin-semiconductor region 13, respectively. At this point, the conditions for the plasma doping are, e.g., as follows: the material gas is $AsH_3$ (arsine) diluted with He (helium); the $AsH_3$ concentration in the material gas is 0.5% by mass; the $AsH_3$ flow rate is 0.12 cm³/minute (standard state); the total flow rate of the material gas is 475 cm³/minute (standard state); the pressure in the chamber is 0.5 Pa; the source power (high-frequency power for plasma generation) is 500 W; the bias voltage (Vpp) is 250 V; the substrate temperature is 22° C.; and the plasma doping time is 60 seconds.

As a feature of the present embodiment, in the plasma doping for forming the source/drain region 27, $AsH_3$ which is the impurity-containing gas is used, as well as a slight amount of oxygen ($O_2$) gas diluted with He is used as the oxygen-containing gas. The $O_2$ concentration in the $O_2$/He gas mixture is, e.g., 1.0% by mass. The $O_2$ flow rate is, e.g., 0.0166 cm³/minute (standard state), and the total flow rate of the $O_2$/He gas mixture is, e.g., 13.2 cm³/minute (standard state). This suppresses spreading resistance in the fourth N-type impurity region 27b which corresponds to the source/drain region 27 in the side portion of the fin-semiconductor region 13 to about $9.09 \times 10^3 \Omega$.

Next, as illustrated in FIG. 1(g), the resist pattern 19 is removed by, e.g., the cleaning, and then activation heat treatment is performed to activate As introduced to each of the extension region 17 and the source/drain region 27. In such a manner, a fin-FET can be formed.

Figure 2:
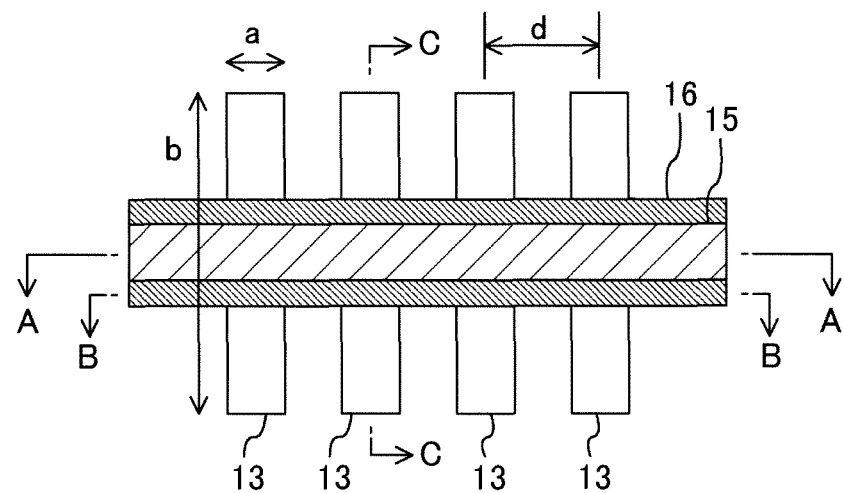
FIGS. 2(a)-2(c) are views illustrating a structure of the semiconductor device of the embodiment.
Figure 2:
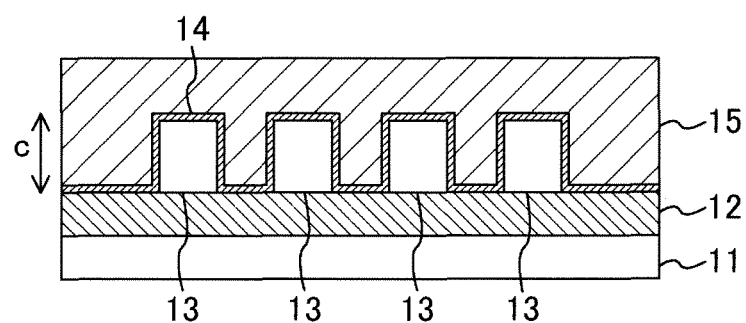
Figure 2:
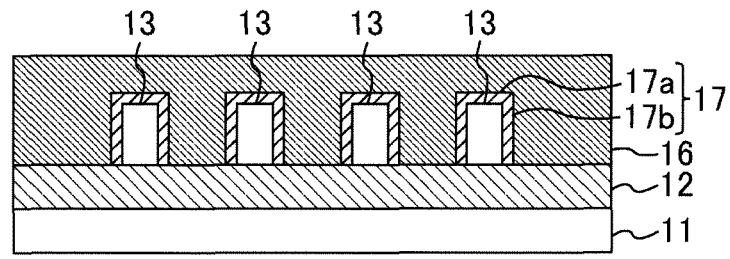

FIGS. 2(a)-2(c) are views illustrating a structure of the fin-FET of the present embodiment, which is formed in the foregoing manner. FIG. 2(a) is a plan view, FIG. 2(b) is a cross-sectional view along an A-A line of FIG. 2(a), and FIG. 2(c) is a cross-sectional view along a B-B line of FIG. 2(a). Note that FIG. 1(g) corresponds to a cross-sectional view of a main part along a C-C line of FIG. 2(a).

As illustrated in FIGS. 2(a)-2(c) and 1(g), the fin-FET of the present embodiment includes the support substrate 11 made of, e.g., silicon; the insulating layer 12 formed on the support substrate 11 and made of, e.g., silicon oxide; a plurality of fin-semiconductor regions 13 formed on the insulating layer 12; the gate electrode 15 formed on each of the fin-semiconductor regions 13 with the gate insulating film 14 being interposed therebetween; the insulating sidewall-spacer 16 formed on the side surface of the gate electrode 15; the extension regions 17 formed in both side regions of each of the fin-semiconductor regions 13 so as to sandwich the gate electrode 15; and the source/drain regions 27 formed in both side regions of each of the fin-semiconductor regions 13 so as to sandwich the gate electrode 15 and the insulating sidewall-spacer 16. The fin-semiconductor regions 13 are arranged at regular intervals in the gate width direction on the insulating layer 12. The gate electrode 15 is formed so as to extend over the fin-semiconductor regions 13 in the gate width direction. The extension region 17 includes the first N-type impurity region 17a formed in the upper portion of the fin-semiconductor region 13, and the second N-type impurity region 17b formed in the side portions of the fin-semiconductor region 13. In addition, the source/drain region 27 includes the third N-type impurity region 27a formed in the upper portion of the fin-semiconductor region 13, and the fourth N-type impurity region 27b formed in the side portions of the fin-semiconductor region 13. Note that a pocket region is not described and is not shown in the figure.

As described above, according to the present embodiment, since the impurity-containing gas and the oxygen-containing gas are together used in the plasma doping for forming the extension region 17, resistance in the second N-type impurity region 17b formed in the side portion of the fin-semiconductor region 13 can be reduced as compared to a case where plasma doping with an impurity is performed in atmosphere which does not contain oxygen at all. Thus, a fin-type semiconductor device having desired properties can be realized. In addition, the resistance in the second N-type impurity region 17b formed in the side portion of the fin-semiconductor region 13 can be reduced. Thus, even if a proportion of a width of the second N-type impurity region 17b in a width of the extension region 17 in the gate width direction is increased, desired transistor characteristics can be obtained.

According to the present embodiment, since the impurity-containing gas and the oxygen-containing gas are together used in the plasma doping for forming the source/drain region 27, resistance in the fourth N-type impurity region 27b formed in the side portion of the fin-semiconductor region 13 can be reduced as compared to the case where the plasma doping of the impurity is performed in the atmosphere which does not contain oxygen at all. Thus, the fin-type semiconductor device having desired properties can be realized. In addition, the resistance in the fourth N-type impurity region 27b formed in the side portion of the fin-semiconductor region 13 can be reduced. Thus, even if a proportion of a width of the fourth N-type impurity region 27b in a width of the source/drain region 27 in the gate width direction is increased, the desired transistor characteristics can be obtained. Further, since the resistance in the fourth N-type impurity region 27b formed in the side portion of the fin-semiconductor region 13 can be set to a level similar to that of resistance in the extension region 17. As a result, carrier movement from the source/drain region 27 to the extension region 17 is facilitated, thereby obtaining the desired transistor characteristics.

According to the present embodiment, since the plasma doping is used in order to form the extension region 17 and the source/drain region 27 in the fin-semiconductor region 13, a problem can be avoided, in which crystal restoration after annealing is difficult due to amorphizing of a fin-semiconductor region as in a case where ion implantation is used.

Note that, in the present embodiment, a triple-gate fin-type semiconductor device is fabricated, which includes the extension regions 17 and the source/drain regions 27 in the upper portion and the both side portions of the fin-semiconductor region 13. However, instead of fabricating such a semiconductor device, a double-gate fin-type semiconductor device may be fabricated, which includes extension regions 17 and source/drain regions 27 only in both side portions of a fin-semiconductor region 13.

According to the present embodiment, in the plasma doing for forming the extension region 17 and the source/drain region 27, the conditions are set as follows: the $AsH_3$ concentration in the material gas ($AsH_3$ diluted with He, and the same applies in the description below) is 0.5% by mass; the $AsH_3$ flow rate is 0.12 $cm^3$/minute (standard state); and the total flow rate of the material gas is 475 $cm^3$/minute (standard state). However, the present invention is not limited to such conditions. The $AsH_3$ concentration in the material gas may be set to any values equal to or greater than 0.5% by mass, the $AsH_3$ flow rate may be set to any values equal to or greater than 0.12 $cm^3$/minute (standard state), and the total flow rate of the material gas may be set to any values equal to or greater than 475 $cm^3$/minute (standard state).

According to the present embodiment, in the plasma doping for forming the extension region 17 and the source/drain region 27, the conditions are set as follows: the $O_2$ concentration in the $O_2$/He gas mixture is 1.0% by mass; and the $O_2$ flow rate is 0.0166 $cm^3$/minute (standard state). However, the present invention is not limited to such conditions. The $O_2$ concentration in the $O_2$/He gas mixture may be set to equal to or greater than 0.000168% by mass and equal to or less than 3.24% by mass, and the $O_2$ flow rate may be set to equal to or greater than 0.0001 $cm^3$/minute (standard state) and equal to or less than 2.0 $cm^3$/minute (standard state). Note that, if the $O_2$ flow rate is set to less than 0.0001 $cm^3$/minute (standard state), it is less likely to obtain an effect of reducing the resistance in the side portion of the fin-semiconductor region by oxygen addition. On the other hand, if the $O_2$ flow rate is set to greater than 2.0 $cm^3$/minute (standard state), a problem is caused, in which significant oxidation of a silicon region due to oxygen is caused, and therefore a considerable change of a silicon surface into an insulator (formation of an oxide film) due to the oxidation increases resistance in an impurity-doped region. In order to ensure reduction in oxidation of the silicon region due to oxygen and reduce the resistance in the impurity-doped region, it is preferred that the $O_2$ flow rate is set to equal to or less than 0.2 $cm^3$/minute (standard state), and the $O_2$ concentration is set to equal to or less than 0.334% by mass.

In the present embodiment, oxygen ($O_2$) gas is used as the oxygen-containing gas in the plasma doping for forming the extension region 17 and the source/drain region 27. However, instead of using the oxygen gas, other oxygen-containing gas such as $H_2O$, $N_2O$, or $CO_2$ may be used. Alternatively, two or more such oxygen-containing gases including $O_2$ may be used.

In the present embodiment, $AsH_3$ diluted with He is used as the material gas for the plasma doping for forming the extension region 17 and the source/drain region 27. However, the material gas is not limited to the foregoing as long as the material gas contains the impurity to be introduced to the fin-semiconductor region 13. For example, instead of $AsH_3$, other molecules such as molecules containing arsenic atoms or molecules containing arsenic atoms and hydrogen atoms may be used. Alternatively, e.g., $PH_3$ containing phosphorus (P) atoms may be used. In particular, if an N-type impurity having poor adsorption to the semiconductor is introduced as the impurity by the plasma doping, the foregoing effect can be remarkably obtained as compared to the prior art. In addition, if gas containing a P-type impurity such as boron is used as the material gas, the effect of reducing the resistance in the impurity-doped region of the side portions of the fin-semiconductor region can be also obtained as compared to the prior art.

In the present embodiment, He is used as dilution gas with which the impurity-containing gas and the oxygen-containing gas are diluted in the plasma doping. However, instead of using such dilution gas, e.g., other noble gas such as neon (Ne) or hydrogen ($H_2$) may be used. Alternatively, the impurity-containing gas and the oxygen-containing gas may not be diluted with the dilution gas.

In the present embodiment, a method for generating plasma is not limited, and, e.g., the plasma generation method such as the ICP method or the pulse method may be used.

An apparatus configuration which can be used for the plasma doping of the present embodiment, variations of a process flow including the plasma doping of the present embodiment, and details of advantages of the present embodiment will be successively described below.

[Apparatus Configuration which can be Used for Plasma Doping]

First, the apparatus configuration which can be used for the plasma doping of the present embodiment will be described with reference to the drawings.

Figure 3:
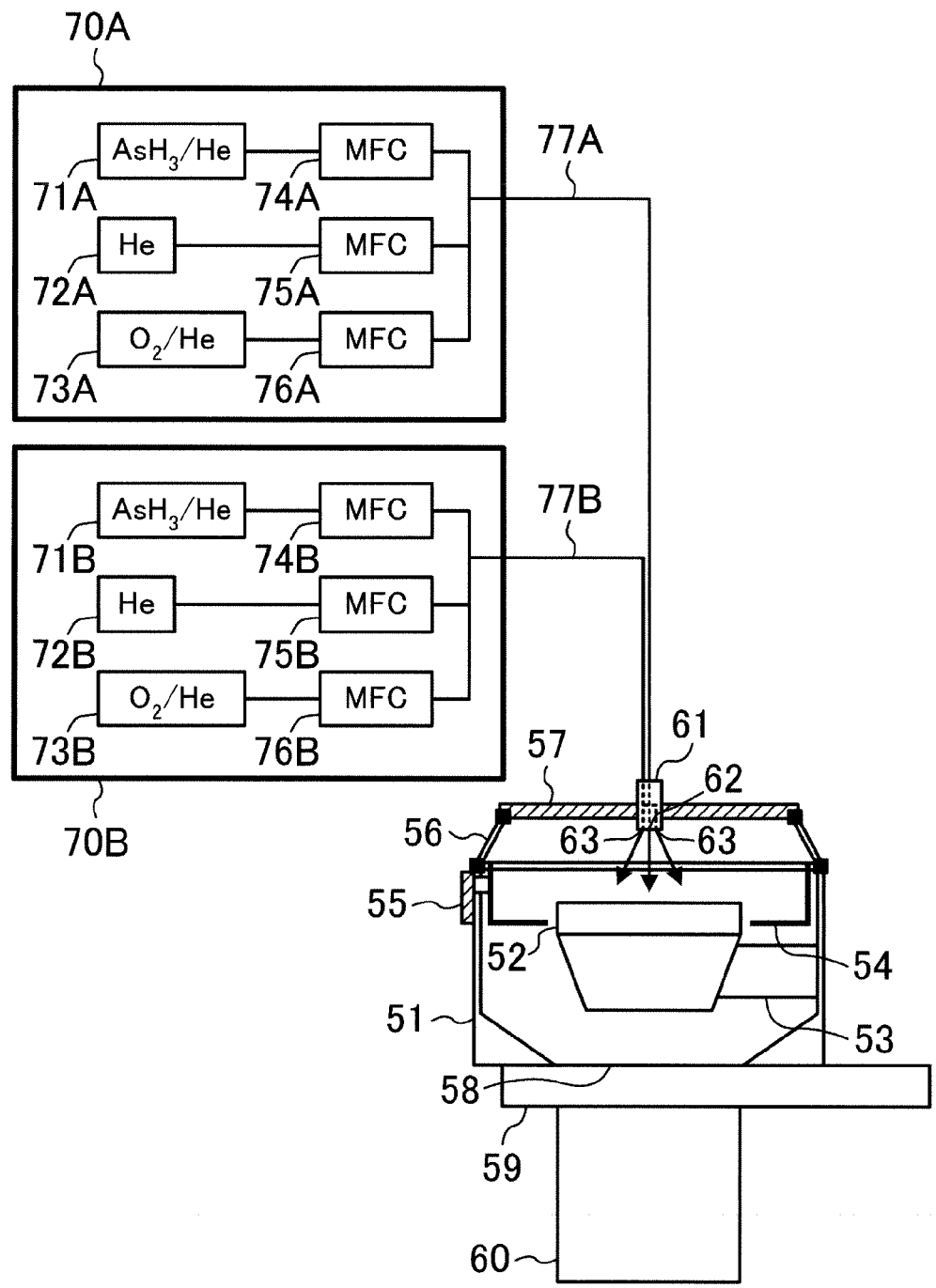
FIG. 3 is a view illustrating a schematic configuration of a first example of a plasma doping apparatus of the embodiment.

FIG. 3 is a view illustrating a schematic configuration of a first example of an apparatus which can be used for the plasma doping of the present embodiment.

As illustrated in FIG. 3, a lower electrode 52 on which a wafer to be processed is mounted is supported by a support portion 53 inside a chamber body 51 in which plasma is generated. An inner chamber 54 is provided in an upper portion of the chamber body 51 so as to surround the lower electrode 52. A wafer delivery gate 55 is provided in the inner chamber 54. An upper chamber 56 and a top plate 57 are provided so as to cover the inner chamber 54. A discharge port 58 is provided in a bottom portion of the chamber body 51, and an exhaust pump 60 is attached to the discharge port 58 through an exhaust valve 59.

A gas injector 61 is provided so as to penetrate the top plate 57. Impurity-containing gas (e.g., $AsH_3$ diluted with He) and oxygen-containing gas (e.g., $O_2$ diluted with He) are supplied from a gas supply section 70A and a gas supply section 70B to the gas injector 61 through a gas supply line 77A and a gas supply line 77B. Gas supplied from the gas supply section 70A to the gas injector 61 through the gas supply line 77A is discharged to a middle portion of the wafer to be processed mounted in the chamber body 51 through a gas supply port 62. In addition, gas supplied from the gas supply section 70B to the gas injector 61 through the gas supply line 77B is discharged to a peripheral portion of the wafer to be processed mounted in the chamber body 51 through a gas supply port 63.

The gas supply section 70A includes, e.g., an $AsH_3$/He gas mixture cylinder 71A, an He gas cylinder 72A, an $O_2$/He gas mixture cylinder 73A, a mass flow controller (hereinafter referred to as an "MFC") 74A for controlling a flow rate of an $AsH_3$/He gas mixture to be supplied from the $AsH_3$/He gas mixture cylinder 71A to the gas supply line 77A, an MFC 75A for controlling a flow rate of He gas to be supplied from the He gas cylinder 72A to the gas supply line 77A, and an MFC 76A for controlling a flow rate of an $O_2$/He gas mixture to be supplied from the $O_2$/He gas mixture cylinder 73A to the gas supply line 77A.

The gas supply section 70B includes, e.g., an $AsH_3$/He gas mixture cylinder 71B, an He gas cylinder 72B, an $O_2$/He gas mixture cylinder 73B, an MFC 74B for controlling a flow rate of an $AsH_3$/He gas mixture to be supplied from the $AsH_3$/He gas mixture cylinder 71B to the gas supply line 77B, an MFC 75B for controlling a flow rate of He gas to be supplied from the He gas cylinder 72B to the gas supply line 77B, and an MFC 76B for controlling a flow rate of an $O_2$/He gas mixture to be supplied from the $O_2$/He gas mixture cylinder 73B to the gas supply line 77B.

As described above, the first example of the plasma doping apparatus illustrated in FIG. 3 has the configuration in which $AsH_3$ which is the impurity-containing gas, $O_2$ which is the oxygen-containing gas, and He which is the dilution gas are mixed together, the gas mixture is supplied to the chamber, and plasma is generated by using the gas mixture.

Note that, in the first example of the plasma doping apparatus illustrated in FIG. 3, a monitoring section for measuring an oxygen concentration in plasma may be further provided. In such a manner, while the oxygen concentration in plasma is monitored, the flow rate of the $O_2$/He gas mixture can be properly adjusted by the MFCs 76A, 76B. Thus, the plasma doping can be performed with good controllability.

Figure 4:
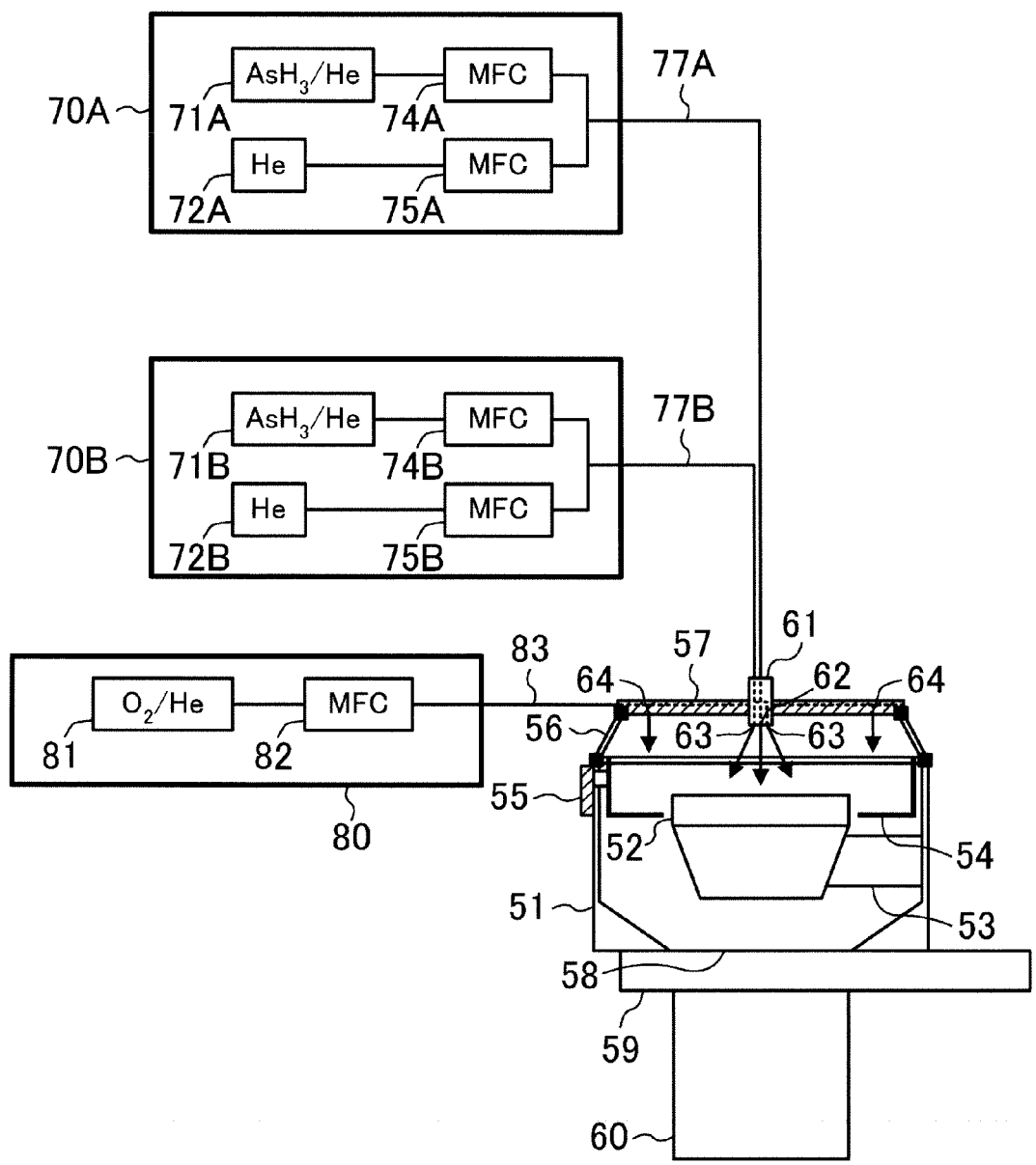
FIG. 4 is a view illustrating a schematic configuration of a second example of the plasma doping apparatus of the embodiment.

FIG. 4 is a view illustrating a schematic configuration of a second example of the apparatus which can be used for the plasma doping of the present embodiment. Note that the same reference numerals as those shown in the first example of the plasma doping apparatus illustrated in FIG. 3 are used to represent equivalent elements in FIG. 4, and the description thereof will not be repeated.

Differences between the second example of the plasma doping apparatus illustrated in FIG. 4 and the first example of the plasma doping apparatus illustrated in FIG. 3 are as follows. That is, in the second example of the plasma doping apparatus illustrated in FIG. 4, the $O_2$/He gas mixture cylinder 73A and the MFC 76A are not provided in the gas supply section 70A, and the $O_2$/He gas mixture cylinder 73B and the MFC 76B are not provided in the gas supply section 70B. That is, impurity-containing gas (e.g., $AsH_3$ diluted with He) is supplied from the gas supply sections 70A, 70B to the gas injector 61 through the gas supply lines 77A, 77B, and oxygen-containing gas (e.g., $O_2$ diluted with He) is not supplied. On the other hand, in the second example of the plasma doping apparatus illustrated in FIG. 4, a gas supply section 80 is provided. Oxygen-containing gas (e.g., $O_2$ diluted with He) supplied from the gas supply section 80 passes through a gas supply line 83, and is discharged to the peripheral portion of the wafer to be processed mounted in the chamber body 51 through a gas supply port 64 provided in the top plate 57. The gas supply section 80 includes, e.g., an $O_2$/He gas mixture cylinder 81, and an MFC 82 for controlling a flow rate of an $O_2$/He gas mixture to be supplied from the $O_2$/He gas mixture cylinder 81 to the gas supply line 83.

As described above, the second example of the plasma doping apparatus illustrated in FIG. 4 has the configuration in which $AsH_3$ which is the impurity-containing gas and $O_2$ which is the oxygen-containing gas are separately supplied to the chamber, such gases are mixed together in the chamber, and plasma is generated by using the gas mixture. In such a manner, safety when the plasma doping is performed is improved.

Note that, in the second example of the plasma doping apparatus illustrated in FIG. 4, a monitoring section for measuring an oxygen concentration in plasma may be further provided. In such a manner, while the oxygen concentration in plasma is monitored, the flow rate of the $O_2$/He gas mixture can be properly adjusted by the MFC 82. Thus, the plasma doping can be performed with good controllability.

Figure 5:
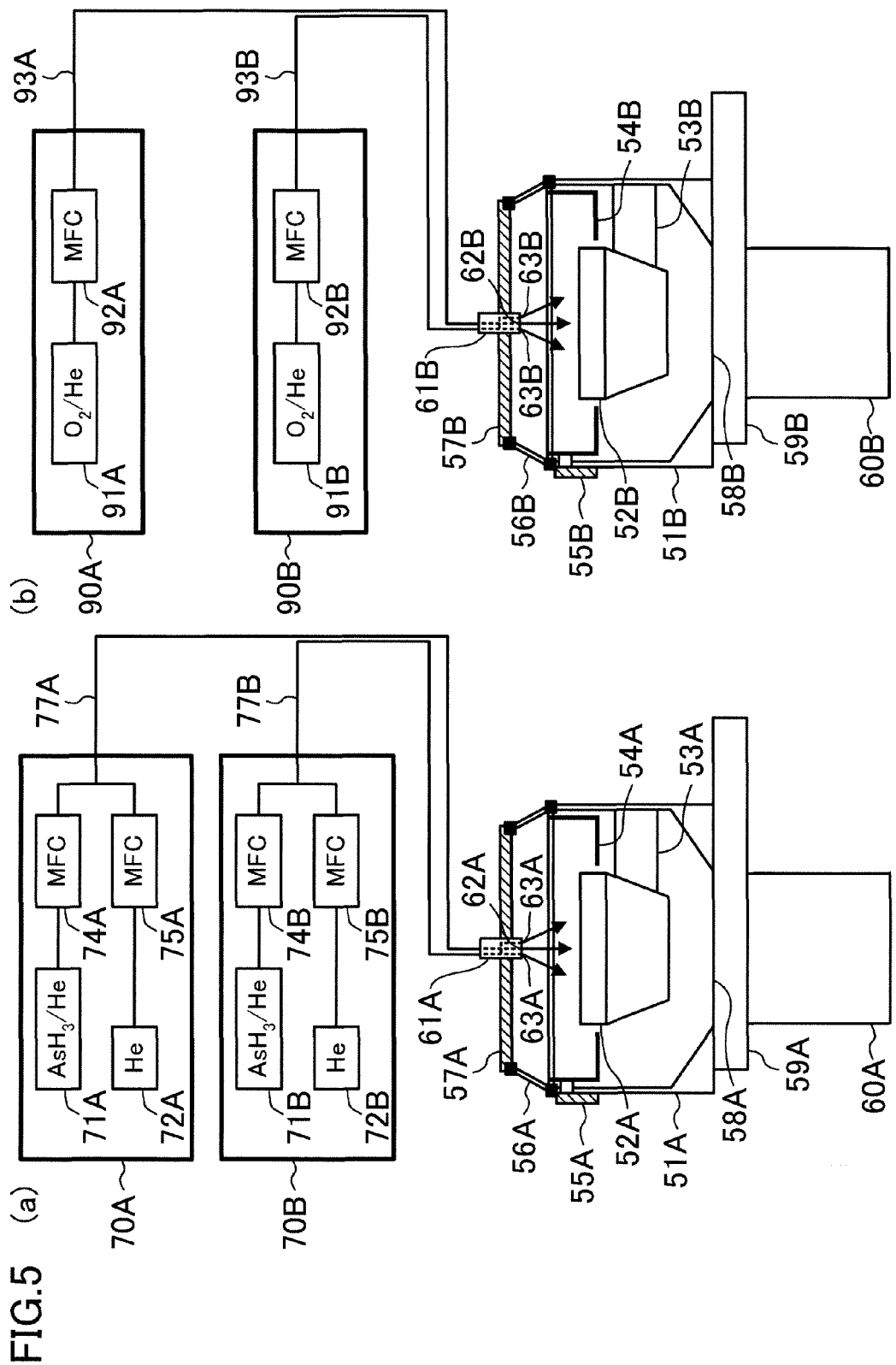
FIGS. 5(a) and 5(b) are views illustrating a schematic configuration of a third example of the plasma doping apparatus of the embodiment.

FIGS. 5(a) and 5(b) are views illustrating a schematic configuration of a third example of the apparatus which can be used for the plasma doping of the present embodiment. That is, the third example of the plasma doping apparatus is configured by combining apparatus sections illustrated in FIGS. 5(a) and 5(b).

In the apparatus section illustrated in FIG. 5(a), a lower electrode 52A on which a wafer to be processed is mounted is supported by a support portion 53A inside a chamber body 51A in which plasma is generated. An inner chamber 54A is provided in an upper portion of the chamber body 51A so as to surround the lower electrode 52A. A wafer delivery gate 55A is provided in the inner chamber 54A. An upper chamber 56A and a top plate 57A are provided so as to cover the inner chamber 54A. A discharge port 58A is provided in a bottom portion of the chamber body 51A, and an exhaust pump 60A is attached to the discharge port 58A through an exhaust valve 59A.

In addition, in the apparatus section illustrated in FIG. 5(a), a gas injector 61A is provided so as to penetrate the top plate 57A. Impurity-containing gas (e.g., $AsH_3$ diluted with He) is supplied from a gas supply section 70A and a gas supply section 70B to the gas injector 61A through a gas supply line 77A and a gas supply line 77B. Gas supplied from the gas supply section 70A to the gas injector 61A through the gas supply line 77A is discharged to a middle portion of the wafer to be processed mounted in the chamber body 51A through a gas supply port 62A. In addition, gas supplied from the gas supply section 70B to the gas injector 61A through the gas supply line 77B is discharged to a peripheral portion of the wafer to be processed mounted in the chamber body 51A through a gas supply port 63A.

The gas supply section 70A includes, e.g., an $AsH_3$/He gas mixture cylinder 71A, an He gas cylinder 72A, an MFC 74A for controlling a flow rate of an $AsH_3$/He gas mixture to be supplied from the $AsH_3$/He gas mixture cylinder 71A to the gas supply line 77A, and an MFC 75A for controlling a flow rate of He gas to be supplied from the He gas cylinder 72A to the gas supply line 77A.

The gas supply section 70B includes, e.g., an $AsH_3$/He gas mixture cylinder 71B, an He gas cylinder 72B, an MFC 74B for controlling a flow rate of an $AsH_3$/He gas mixture to be supplied from the $AsH_3$/He gas mixture cylinder 71B to the gas supply line 77B, and an MFC 75B for controlling a flow rate of He gas to be supplied from the He gas cylinder 72B to the gas supply line 77B.

On the other hand, in the apparatus section illustrated in FIG. 5(b), a lower electrode 52B on which a wafer to be processed is mounted is supported by a support portion 53B inside a chamber body 51B in which plasma is generated. An inner chamber 54B is provided in an upper portion of the chamber body 51B so as to surround the lower electrode 52B. A wafer delivery gate 55B is provided in the inner chamber 54B. An upper chamber 56B and a top plate 57B are provided so as to cover the inner chamber 54B. A discharge port 58B is provided in a bottom portion of the chamber body 51B, and an exhaust pump 60B is attached to the discharge port 58B through an exhaust valve 59B.

In addition, in the apparatus section illustrated in FIG. 5(b), a gas injector 61B is provided so as to penetrate the top plate 57B. Oxygen-containing gas (e.g., $O_2$ diluted with He) is supplied from a gas supply section 90A and a gas supply section 90B to the gas injector 61B through a gas supply line 93A and a gas supply line 93B. Gas supplied from the gas supply section 90A to the gas injector 61B through the gas supply line 93A is discharged to a middle portion of the wafer to be processed mounted in the chamber body 51B through a gas supply port 62B. In addition, gas supplied from the gas supply section 70B to the gas injector 61B through the gas supply line 77B is discharged to a peripheral portion of the wafer to be processed mounted in the chamber body 51B through a gas supply port 63B.

The gas supply section 90A includes, e.g., an $O_2$/He gas mixture cylinder 91A and an MFC 92A for controlling a flow rate of an $O_2$/He gas mixture to be supplied from the $O_2$/He gas mixture cylinder 91A to the gas supply line 93A.

The gas supply section 90B includes, e.g., an $O_2$/He gas mixture cylinder 91B and an MFC 92B for controlling a flow rate of an $O_2$/He gas mixture to be supplied from the $O_2$/He gas mixture cylinder 91B to the gas supply line 93B.

As described above, the third example of the plasma doping apparatus includes the apparatus section (FIG. 5(a)) in which $AsH_3$ which is the impurity-containing gas is supplied to one of the chambers, and plasma is generated by using the impurity-containing gas; and the apparatus section (FIG. 5(b)) in which $O_2$ which is the oxygen-containing gas is supplied to the other chamber, and plasma is generated by using the oxygen-containing gas. A process flow using the third example of the plasma doping apparatus will be described later.

Note that, in the apparatus section of the third example of the plasma doping apparatus as illustrated in FIG. 5(b), a monitoring section for measuring an oxygen concentration in plasma may be further provided. In such a manner, while the oxygen concentration in plasma is monitored, the flow rate of the $O_2$/He gas mixture can be properly adjusted by the MFCs 92A, 92B. Thus, the plasma doping can be performed with good controllability.

In the third example of the plasma doping apparatus, wafer movement between the apparatus section illustrated in FIG. 5(a) and the apparatus section illustrated in FIG. 5(b) is preferably performed in vacuum or in inert gas atmosphere.

In the first to third examples of the plasma doping apparatus, the apparatus configuration has been described with the example where $AsH_3$ is used as the impurity-containing gas and $O_2$ is used as the oxygen-containing gas. Needless to say, the apparatus configuration (particularly the gas supply section) may be arbitrarily changed depending on gas to be used. In addition, the apparatus configuration (particularly a chamber configuration) may be arbitrarily changed depending on the plasma generation method to be employed.

[Variations of Process Flow]

Next, the variations of the process flow including the plasma doping of the present embodiment will be described with reference to the drawings.

Figure 6:
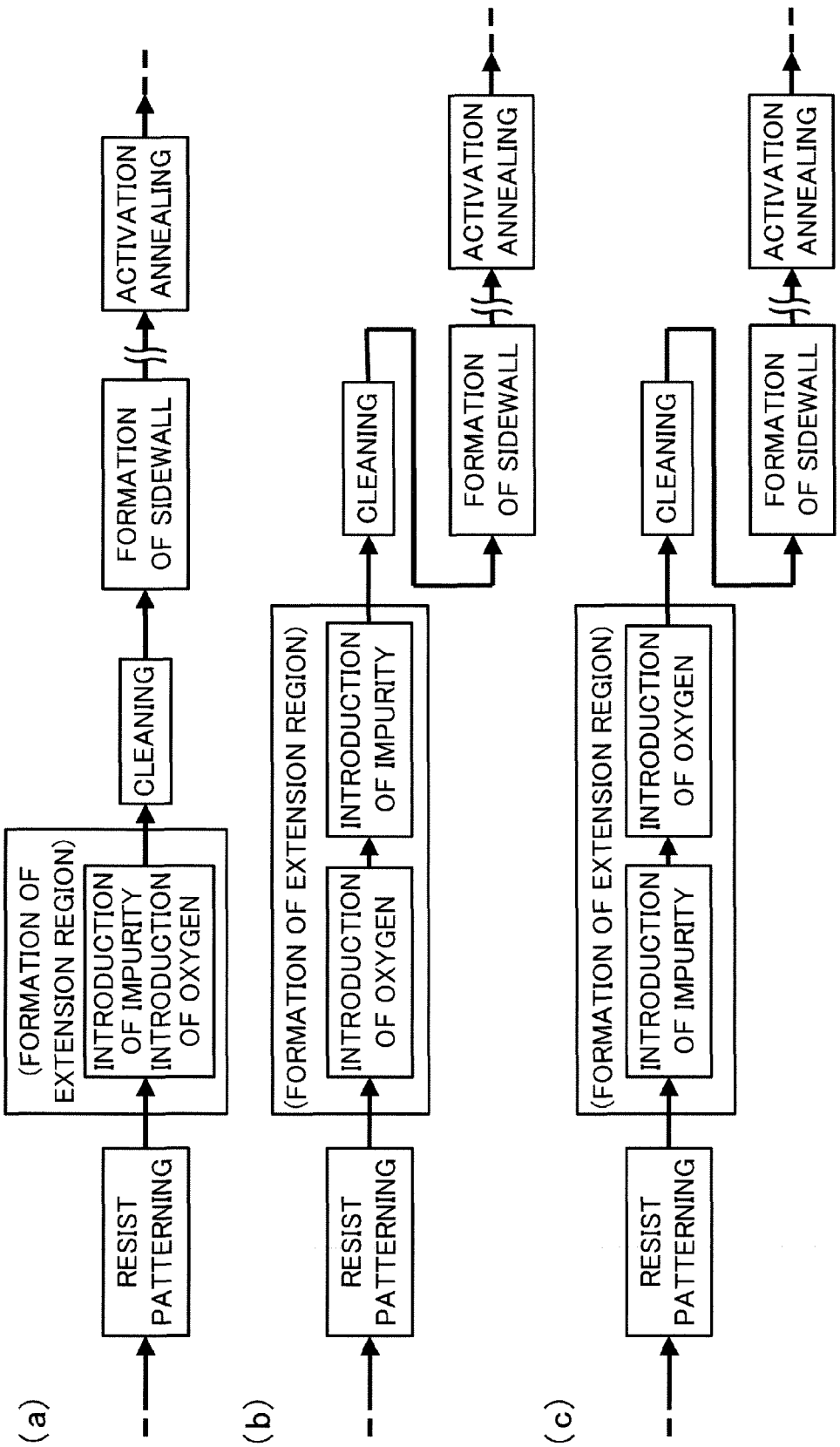
FIG. 6(a) is a process flow of the semiconductor device fabricating method of the embodiment.
FIG. 6(b) is a process flow of a semiconductor device fabricating method of a first variation of the present embodiment.
FIG. 6(c) is a process flow of a semiconductor device fabricating method of a second variation of the present embodiment.

FIG. 6(a) is a process flow briefly illustrating the semiconductor device fabricating method of the present embodiment illustrated in FIGS. 1(a)-1(g). Note that a step for forming a gate electrode, a step for forming a source/drain region, etc. are not shown in the figure.

A feature of the process flow of the present embodiment as illustrated in FIG. 6(a) is that, in plasma doping for forming an extension region, impurity-containing gas and a slight amount of oxygen-containing gas are together used. In such a manner, a side surface of a fin-semiconductor region to which an impurity is adhered can be covered with a thin oxide layer. As a result, outward diffusion of impurity having poor adsorption in the activation heat treatment etc. can be suppressed, thereby reducing resistance in an impurity region formed in a side portion of the fin-semiconductor region. In addition, formation of the oxide layer increases interstitial Si contained in semiconductor crystal (specifically Si crystal). Thus, an advantage can be obtained, in which activation of the impurity is accelerated in the activation heat treatment etc. which are steps after the formation of the oxide layer, thereby reducing the resistance in the impurity region.

The process flow of the present embodiment as illustrated in FIG. 6(a) can be implemented, e.g., by using the plasma doping apparatus illustrated in FIG. 3 or 4.

FIG. 6(b) illustrates a process flow of a first variation. Note that a step for forming a gate electrode, a step for forming a source/drain region, etc. are not shown in the figure.

A difference between the process flow of the first variation and the process flow of the present embodiment is that, as illustrated in FIG. 6(b), when an extension region is formed, oxygen-containing gas is used to perform first plasma doping on a fin-semiconductor region, and then impurity-containing gas is used to perform second plasma doping on the fin-semiconductor region. In such a case, a mechanism similar to that of the process flow of the present embodiment works for an impurity passing through an oxide layer formed on a side surface of the fin-semiconductor region in advance and adhered to the side surface of the fin-semiconductor region, thereby reducing resistance in an impurity region formed in a side portion of the fin-semiconductor region. Formation of the oxide layer increases interstitial Si contained in semiconductor crystal (specifically Si crystal). Thus, an advantage can be obtained, in which activation of the impurity is accelerated in activation heat treatment etc. which are steps after the formation of the oxide layer, thereby reducing the resistance in the impurity region.

The process flow of the first variation illustrated in FIG. 6(b) can be implemented, e.g., as follows: the plasma doping apparatus illustrated in FIG. 3 or 4 is used to supply oxygen-containing gas to a chamber and generate first plasma, and then impurity-containing gas is supplied to the same chamber to generate second plasma. Alternatively, the process flow of the first variation illustrated in FIG. 6(b) can be also implemented as follows: the plasma doping apparatus illustrated in FIGS. 5(a) and 5(b) is used to supply oxygen-containing gas to the chamber illustrated in FIG. 5(b) and generate first plasma, and then impurity-containing gas is supplied to the chamber illustrated in FIG. 5(a) to generate second plasma.

FIG. 6(c) illustrates a process flow of a second variation. Note that a step for forming a gate electrode, a step for forming a source/drain region, etc. are not shown in the figure.

A difference between the process flow of the second variation and the process flow of the present embodiment is that, as illustrated in FIG. 6(c), when an extension region is formed, impurity-containing gas is used to perform first plasma doping on a fin-semiconductor region, and then oxygen-containing gas is used to perform second plasma doping on the fin-semiconductor region. In such a case, a mechanism similar to that of the process flow of the present embodiment works for an impurity adhered to a side surface of the fin-semiconductor region, thereby reducing resistance in an impurity region formed in a side portion of the fin-semiconductor region. Formation of an oxide layer increases interstitial Si contained in semiconductor crystal (specifically Si crystal). Thus, an advantage can be obtained, in which activation of the impurity is accelerated in activation heat treatment etc. which are steps after the formation of the oxide layer, thereby reducing the resistance in the impurity region.

The process flow of the second variation illustrated in FIG. 6(c) can be implemented, e.g., as follows: the plasma doping apparatus illustrated in FIG. 3 or 4 is used to supply impurity-containing gas to a chamber and generate first plasma, and then oxygen-containing gas is supplied to the same chamber to generate second plasma. Alternatively, the process flow of the second variation illustrated in FIG. 6(c) can be also implemented as follows: the plasma doping apparatus illustrated in FIGS. 5(a) and 5(b) is used to supply impurity-containing gas to the chamber illustrated in FIG. 5(a) and generate first plasma, and then oxygen-containing gas is supplied to the chamber illustrated in FIG. 5(b) to generate second plasma.

Needless to say, although the variations of the process flow have been described with the example of the step for forming the extension region, similar variations of the process flow are allowed at the step for forming the source/drain region.

[Details of Advantages]

Next, the details of the advantages of the present embodiment will be described with reference to the drawings.

Figure 7:
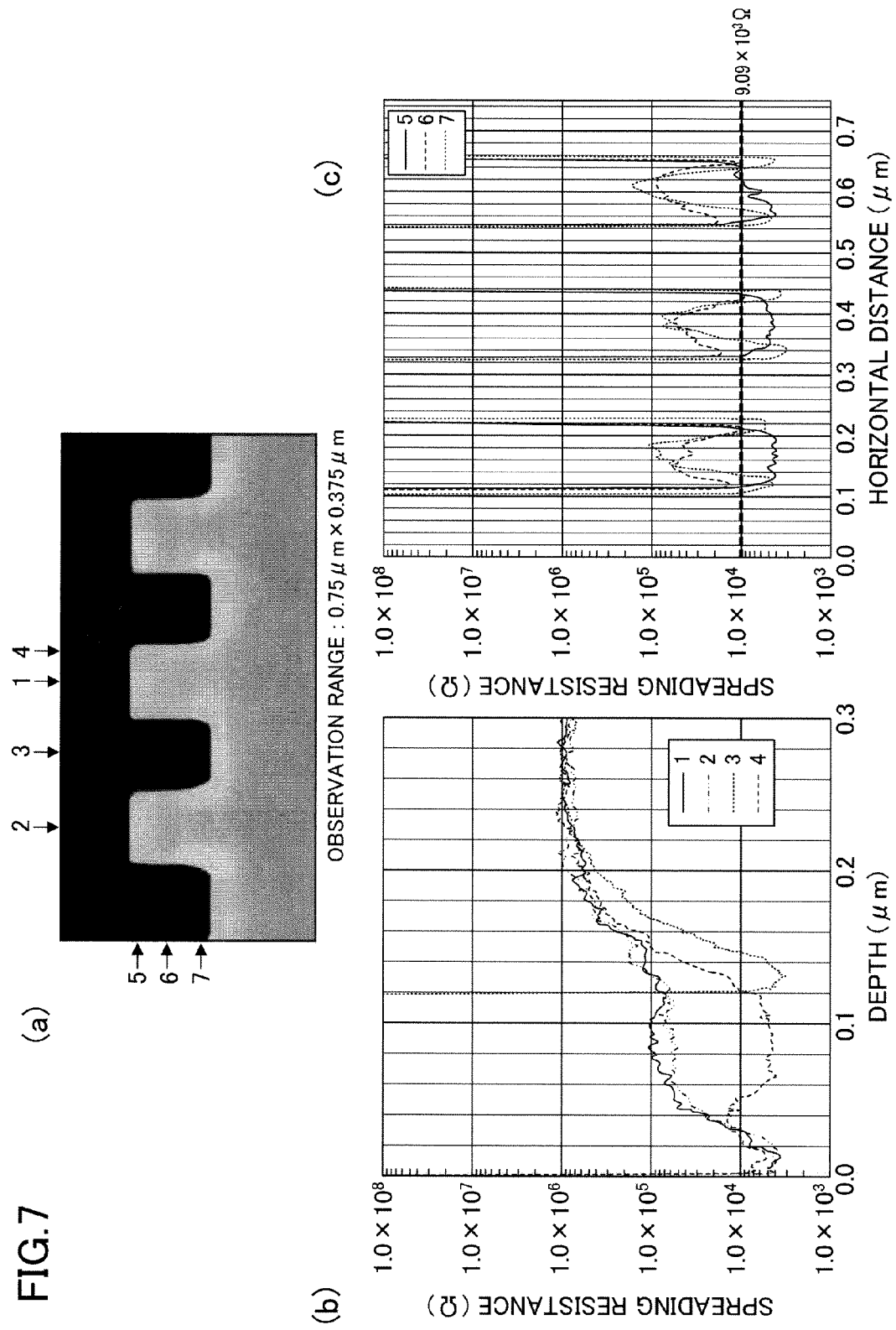
FIG. 7(a) is a view illustrating a fin-type semiconductor device obtained by the semiconductor device fabricating method of the embodiment.
FIG. 7(b) is a graph illustrating a relationship between spreading resistance and a depth in an upper portion of a fin-semiconductor region of the fin-type semiconductor device.
FIG. 7(c) is a graph illustrating a relationship between spreading resistance and a horizontal distance in a side portion of the fin-semiconductor region of the fin-type semiconductor device.

FIG. 7(a) is a view illustrating the fin-type semiconductor device obtained by the semiconductor device fabricating method of the present embodiment illustrated in FIGS. 1(a)-1(g). FIG. 7(b) is a graph illustrating a relationship between spreading resistance and a depth in the upper portion of the fin-semiconductor region of the fin-type semiconductor device. FIG. 7(c) is a graph illustrating a relationship between spreading resistance and a horizontal distance in the side portion of the fin-semiconductor region of the fin-type semiconductor device. Note that FIG. 7(b) illustrates the relationship between the depth and the spreading resistance at positions 1-4 illustrated in FIG. 7(a), and FIG. 7(c) illustrates the relationship between the horizontal distance and the spreading resistance at positions 5-7 illustrated in FIG. 7(a). A base (0) of the depth in FIG. 7(b) is an upper surface of the fin-semiconductor region, and a base (0) of the horizontal distance in FIG. 7(c) is a left end of a region illustrated in FIG. 7(a). In the description below, the spreading resistance is measured by using 2D scanning spreading resistance microscopy (SSRM), and the sheet resistance is measured by using a four probe method, unless otherwise provided.

As illustrated in FIGS. 7(b) and 7(c), in the fin-type semiconductor device obtained by the semiconductor device fabricating method of the present embodiment, the spreading resistance in the impurity region formed in the side portion of the fin-semiconductor region can be reduced as much as the spreading resistance in the impurity region formed in the upper portion of the fin-semiconductor region is. Specifically, the minimum value for the spreading resistance at position 6 in the side portion of the fin-semiconductor region is about $9.09 \times 10^3 \Omega$, and is equal to or less than half of a value in a comparative example (no oxygen is added in the plasma doping) which will be described later.

Figure 8:
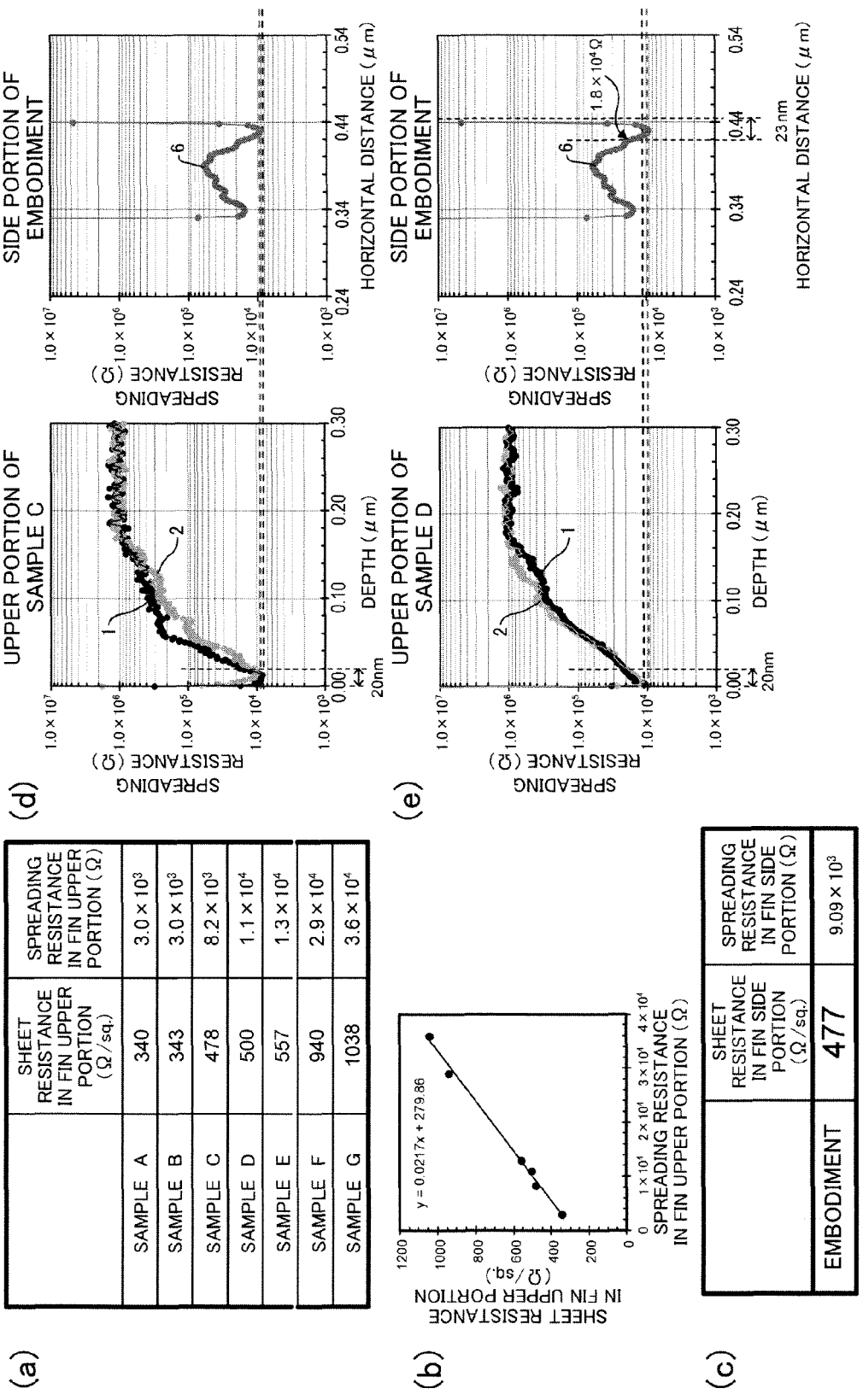
FIG. 8(a) is a table illustrating values for sheet resistance and spreading resistance in the upper portion of the fin-semiconductor region, which are obtained by introducing an impurity under various plasma doping conditions for a plurality of samples.
FIG. 8(b) is a graph illustrating a correlation relationship between the sheet resistance and the spreading resistance illustrated in FIG. 8(a).
FIG. 8(c) is a table illustrating a result obtained by converting the spreading resistance in the side portion of the fin-semiconductor region of the embodiment into the sheet resistance based on the correlation relationship illustrated in FIG. 8(b).
FIG. 8(d) is a graph illustrating the relationship between the horizontal distance and the spreading resistance in the side portion of the fin-semiconductor region of the embodiment as compared to a relationship between a depth and spreading resistance in an upper portion of a fin-semiconductor region of one of the samples.
FIG. 8(e) is a graph illustrating the relationship between the horizontal distance and the spreading resistance in the side portion of the fin-semiconductor region of the embodiment as compared to a relationship between a depth and spreading resistance in an upper portion of a fin-semiconductor region of another sample.

FIG. 8(a) illustrates values for the sheet resistance and the spreading resistance in the upper portion of the fin-semiconductor region, which are obtained by introducing an impurity under various plasma doping conditions for a plurality of samples A-G. FIG. 8(b) is a graph illustrating a correlative relationship between the sheet resistance and the spreading resistance illustrated in FIG. 8(a). The sheet resistance and the spreading resistance illustrated in FIG. 8(a) are obtained by performing the activation heat treatment after the plasma doping. As illustrated in FIG. 8(b), there is a proportional relationship ([sheet resistance y]=0.0217×[spreading resistance x]+279.86) between the sheet resistance and the spreading relationship.

FIG. 8(c) is a value obtained by converting the spreading resistance in the side portion of the fin-semiconductor region of the present embodiment into the sheet resistance based on the correlation relationship illustrated in FIG. 8(b). That is, as illustrated in FIG. 8(c), $9.09 \times 10^3 \Omega$ which is the spreading resistance in the side portion of the fin-semiconductor region of the present embodiment is converted into $477\Omega$/sq. which is the sheet resistance.

FIG. 8(d) illustrates a relationship between the horizontal distance and the spreading resistance at position 6 (see FIG. 7(a)) in the side portion of the fin-semiconductor region of the present embodiment as compared to a relationship between the depth and the spreading resistance at positions 1 and 2 (see FIG. 7(a)) in the upper portion of the fin-semiconductor region of sample C. In addition, FIG. 8(e) illustrates a relationship between the horizontal distance and the spreading resistance at position 6 (see FIG. 7(a)) in the side portion of the fin-semiconductor region of the present embodiment as compared to a relationship between the depth and the spreading resistance at positions 1 and 2 (see FIG. 7(a)) in the upper portion of the fin-semiconductor region of sample D.

As illustrated in FIGS. 8(d) and 8(e), the spreading resistance in the side portion of the fin-semiconductor region of the present embodiment is as low as the spreading resistance in each of the upper portions of the fin-semiconductor regions of samples C and D. A thickness of a region having a resistance value up to twice the minimum value for the spreading resistance in each of the upper portions of the fin-semiconductor regions of samples C and D is about 20 nm. On the other hand, a thickness of a region having a resistance value up to twice the minimum value for the spreading resistance in the side portion of the fin-semiconductor region of the present embodiment is about 23 nm, i.e., substantially the same as those in samples C and D. FIGS. 8(d) and 8(e) show that the conversion of the spreading resistance into the sheet resistance as illustrated in FIG. 8(c) is proper.

Comparative Example

A method for fabricating a semiconductor device in a comparative example and a plasma doping apparatus used for the fabricating method will be together described below with reference to the drawings.

A difference between the semiconductor device fabricating method of the comparative example and the semiconductor device fabricating method of the foregoing embodiment illustrated in FIGS. 1(a)-1(g) is that oxygen-containing gas is not used in plasma doping for forming each of an extension region and a source/drain region.

According to the comparative example, resistance in an impurity region formed in a side portion of a fin-semiconductor region is increased as compared to the foregoing embodiment. Specifically, spreading resistance in the impurity region formed in the side portion of the fin-semiconductor region is about $2.25 \times 10^4 \Omega$, i.e., a value exceeding twice the value in the foregoing embodiment.

Figure 9:
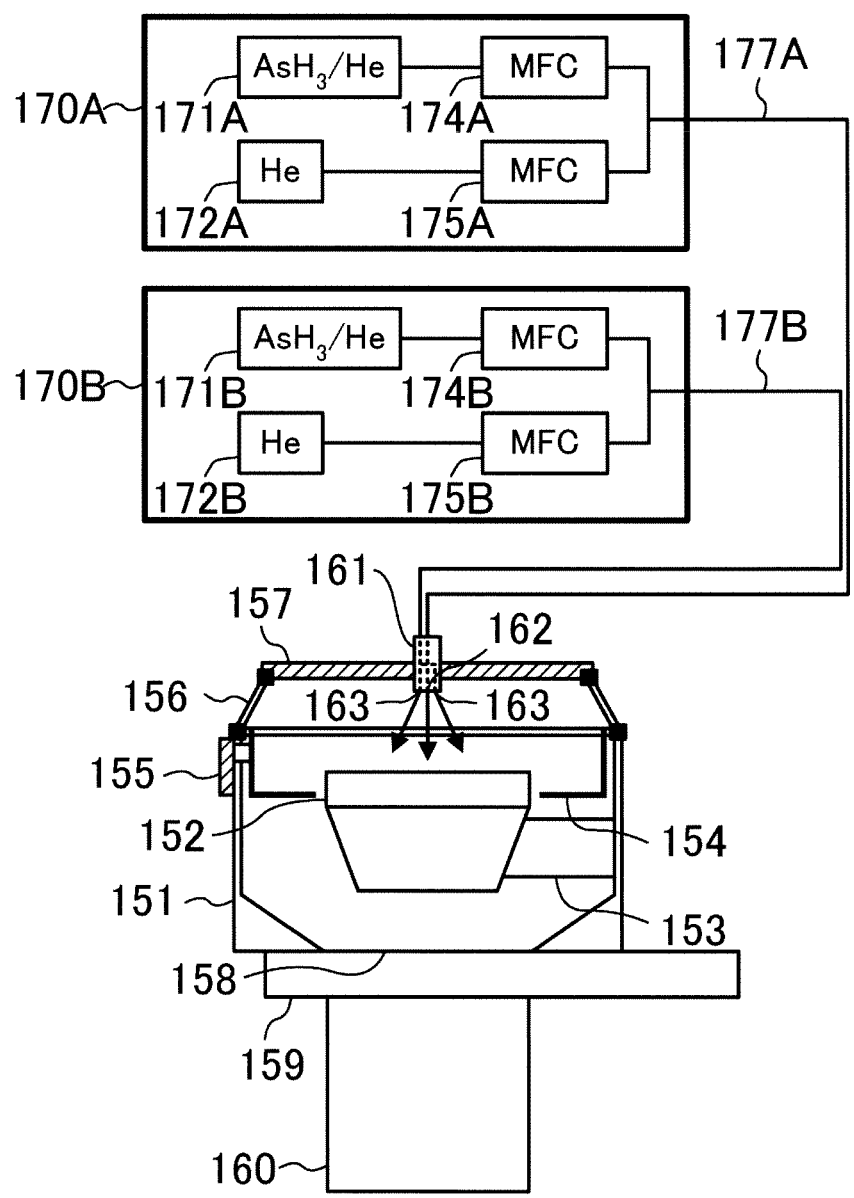
FIG. 9 is a diagram illustrating a schematic configuration of a plasma doping apparatus of a comparative example.

FIG. 9 is a view illustrating a schematic configuration of the apparatus used for the plasma doping in the comparative example.

As illustrated in FIG. 9, a lower electrode 152 on which a wafer to be processed is mounted is supported by a support portion 153 inside a chamber body 151 in which plasma is generated. An inner chamber 154 is provided in an upper portion of the chamber body 151 so as to surround the lower electrode 152. A wafer delivery gate 155 is provided in the inner chamber 154. An upper chamber 156 and a top plate 157 are provided so as to cover the inner chamber 154. A discharge port 158 is provided in a bottom portion of the chamber body 151, and an exhaust pump 160 is attached to the discharge port 158 through an exhaust valve 159.

A gas injector 161 is provided so as to penetrate the top plate 157. Impurity-containing gas (e.g., $AsH_3$ diluted with He) is supplied from a gas supply section 170A and a gas supply section 170B to the gas injector 161 through a gas supply line 177A and a gas supply line 177B. Gas supplied from the gas supply section 170A to the gas injector 161 through the gas supply line 177A is discharged to a middle portion of the wafer to be processed mounted in the chamber body 151 through a gas supply port 162. In addition, gas supplied from the gas supply section 170B to the gas injector 161 through the gas supply line 177B is discharged to a peripheral portion of the wafer to be processed mounted in the chamber body 151 through a gas supply port 163.

The gas supply section 170A includes, e.g., an $AsH_3$/He gas mixture cylinder 171A, an He gas cylinder 172A, an MFC 174A for controlling a flow rate of an $AsH_3$/He gas mixture to be supplied from the $AsH_3$/He gas mixture cylinder 171A to the gas supply line 177A, and an MFC 175A for controlling a flow rate of He gas to be supplied from the He gas cylinder 172A to the gas supply line 177A.

The gas supply section 170B includes, e.g., an $AsH_3$/He gas mixture cylinder 171B, an He gas cylinder 172B, an MFC 174B for controlling a flow rate of an $AsH_3$/He gas mixture to be supplied from the $AsH_3$/He gas mixture cylinder 171B to the gas supply line 177B, and an MFC 175B for controlling a flow rate of He gas to be supplied from the He gas cylinder 172B to the gas supply line 177B.

That is, in the plasma doping apparatus of the comparative example illustrated in FIG. 9, an oxygen-containing gas supply mechanism is not provided as in the plasma doping apparatus of the foregoing embodiment illustrated in FIG. 3, FIG. 4 or FIGS. 5(a) and 5(b).

Figure 10:
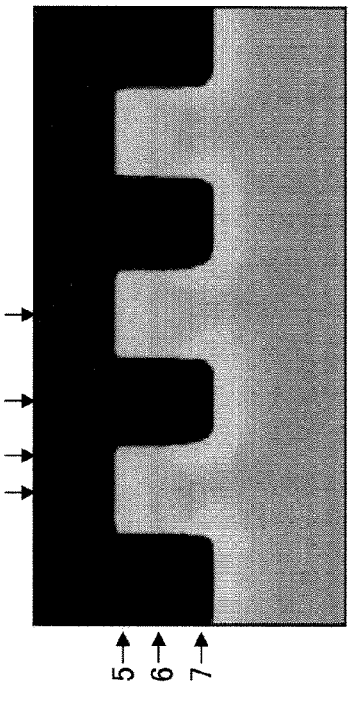
FIG. 10(a) is a view illustrating a fin-type semiconductor device obtained by a semiconductor device fabricating method of the comparative example.
FIG. 10(b) is a graph illustrating a relationship between spreading resistance and a depth in an upper portion of a fin-semiconductor region of the fin-type semiconductor device.
FIG. 10(c) is a graph illustrating a relationship between spreading resistance and a horizontal distance in a side portion of the fin-semiconductor region of the fin-type semiconductor device.
Figure 10:
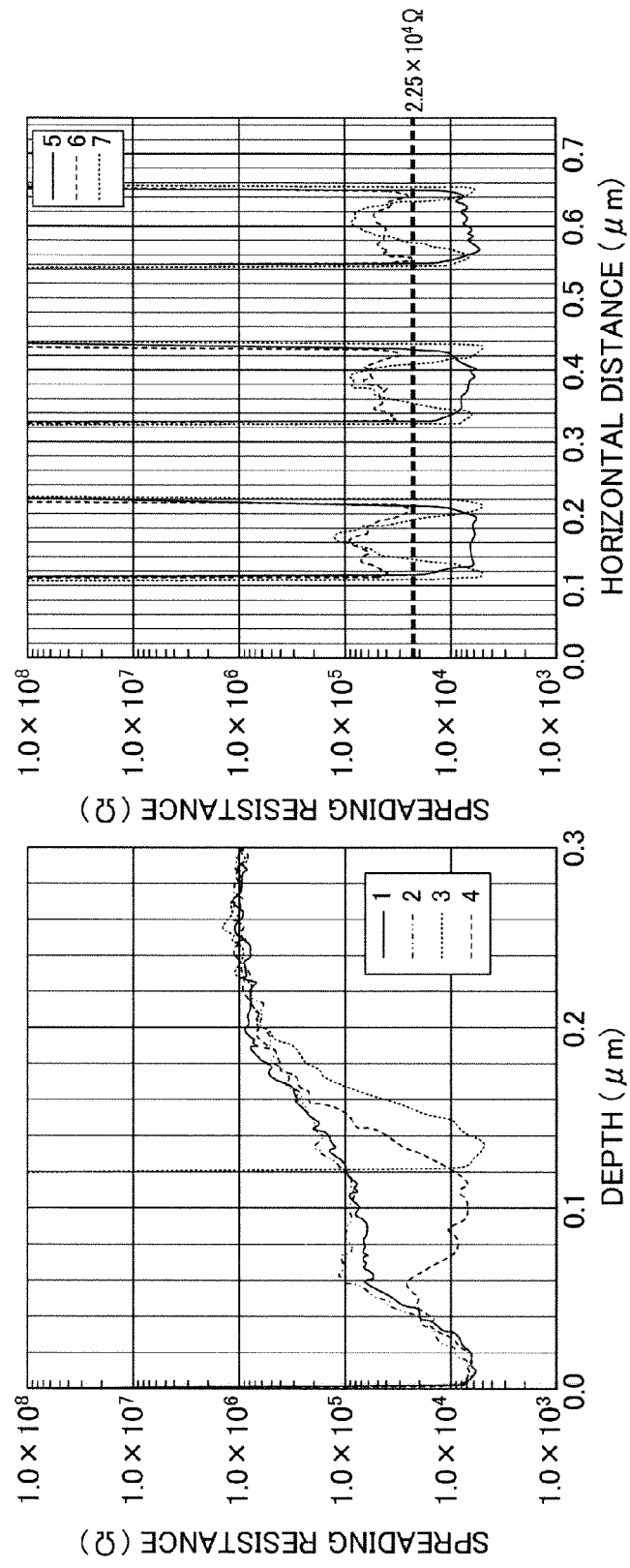

FIG. 10(a) is a view illustrating a fin-type semiconductor device obtained by the semiconductor device fabricating method of the comparative example. FIG. 10(b) is a graph illustrating a relationship between spreading resistance and a depth in an upper portion of the fin-semiconductor region of the fin-type semiconductor device. FIG. 10(c) is a graph illustrating a relationship between spreading resistance and a horizontal distance in the side portion of the fin-semiconductor region of the fin-type semiconductor device. Note that FIG. 10(b) illustrates the relationship between the depth and the spreading resistance at positions 1-4 illustrated in FIG. 10(a), and FIG. 10(c) illustrates the relationship between the horizontal distance and the spreading resistance at positions 5-7 illustrated in FIG. 10(a). A base (0) of the depth in FIG. 10(b) is an upper surface of the fin-semiconductor region, and a base (0) of the horizontal distance in FIG. 10(c) is a left end of a region illustrated in FIG. 10(a). In the description below, the spreading resistance is measured by using the SSRM, and the sheet resistance is measured by using the four probe method, unless otherwise provided.

As illustrated in FIGS. 10(b) and 10(c), in the fin-type semiconductor device obtained by the semiconductor device fabricating method of the comparative example, the spreading resistance in the impurity region formed in the side portion of the fin-semiconductor region is much higher than the spreading resistance in the impurity region formed in the upper portion of the fin-semiconductor region. Specifically, the minimum value for the spreading resistance at position 6 in the side portion of the fin-semiconductor region is about $2.25 \times 10^4 \Omega$, i.e., a value exceeding twice the value of $9.09 \times 10^3 \Omega$ obtained in the foregoing embodiment.

Note that, in the fin-type semiconductor device obtained by the semiconductor device fabricating method of the comparative example, the spreading resistance in the impurity region formed in the upper portion of the fin-semiconductor region is substantially the same as the value (see FIG. 7(b)) obtained in the foregoing embodiment. This shows that an effect of reducing resistance by oxygen addition in the plasma doping is mainly exerted in the side portions of the fin-semiconductor region. This is because an influence of bias voltage on implanted ions is large (see FIG. 10(b)) when an impurity is introduced to the upper surface of the fin-semiconductor region by the plasma doping, and therefore an influence of the effect of reducing the resistance by the oxygen addition on an impurity adsorbed on a semiconductor surface is relatively reduced.

FIG. 11(a) illustrates values for the sheet resistance and the spreading resistance in the upper portion of the fin-semiconductor region, which are obtained by introducing an impurity under various plasma doping conditions for a plurality of samples A-G, and FIG. 11(b) is a graph illustrating a correlation relationship between the sheet resistance and the spreading resistance illustrated in FIG. 11(a). The sheet resistance and the spreading resistance illustrated in FIG. 11(a) are obtained by performing activation heat treatment after the plasma doping. As illustrated in FIG. 11(b), there is a proportional relationship ([sheet resistance y]=0.0217×[spreading resistance x]+279.86) between the sheet resistance and the spreading resistance.

FIG. 11(c) is a value obtained by converting the spreading resistance in the side portion of the fin-semiconductor region of the comparative example into the sheet resistance based on the correlation relationship illustrated in FIG. 11(b). That is, as illustrated in FIG. 11(c), $2.25 \times 10^4 \Omega$ which is the spreading resistance in the side portion of the fin-semiconductor region of the comparative example is converted into 768 Ω/sq. which is the sheet resistance.

FIG. 11(d) illustrates a relationship between the horizontal distance and the spreading resistance at position 6 (see FIG. 10(a)) in the side portion of the fin-semiconductor region of the comparative example as compared to a relationship between the depth and the spreading resistance at positions 1 and 2 (see FIG. 10(a)) in the upper portion of the fin-semiconductor region of sample E. In addition, FIG. 11(e) illustrates a relationship between the horizontal distance and the spreading resistance at position 6 (see FIG. 10(a)) in the side portion of the fin-semiconductor region of the comparative example as compared to a relationship between the depth and the spreading resistance at positions 1 and 2 (see FIG. 10(a)) in the upper portion of the fin-semiconductor region of sample F.

As illustrated in FIGS. 11(d) and 11(e), the spreading resistance in the side portion of the fin-semiconductor region of the comparative example is higher than the spreading resistance in the upper portion of the fin-semiconductor region of sample E, and is lower than the spreading resistance in the upper portion of the fin-semiconductor region of sample F. A thickness of a region having a resistance value up to twice the minimum value for the spreading resistance in the upper portion of the fin-semiconductor region of sample F is about 27 nm. On the other hand, a thickness of a region having a resistance value up to twice the minimum value for the spreading resistance in the side portion of the fin-semiconductor region of the comparative example is about 28 nm, i.e., substantially the same as that in sample F. FIGS. 11(d) and 11(e) show that the conversion of the spreading resistance into the sheet resistance as illustrated in FIG. 11(c) is proper.

INDUSTRIAL APPLICABILITY

As described above, the present invention relates to the semiconductor device fabricating method and the plasma doping apparatus, and is particularly useful for the method for fabricating the semiconductor device of the three-dimensional structure having the fin-semiconductor region on the substrate.

DESCRIPTION OF REFERENCE CHARACTERS

11 Support Substrate
12 Insulating Layer
13 Fin-Semiconductor Region
14 Gate Insulating Film
15A Polysilicon Film
15 Gate Electrode
16 Insulating Sidewall-spacer
17 Extension Region
17a First N-Type Impurity Region
17b Second N-Type Impurity Region
18 Resist Pattern
19 Resist Pattern
27 Source/Drain Region
27a Third N-Type Impurity Region
27b Fourth N-Type Impurity Region
51, 51A, 51B, 151 Chamber Body
52, 52A, 52B, 152 Lower Electrode
53, 53A, 53B, 153 Support Portion
54, 54A, 54B, 154 Inner Chamber
55, 55A, 55B, 155 Wafer Delivery Gate
56, 56A, 56B, 156 Upper Chamber
57, 57A, 57B, 157 Top Plate
58, 58A, 58B, 158 Discharge Port
59, 59A, 59B, 159 Exhaust Valve
60, 60A, 60B, 160 Exhaust Pump
61, 61A, 61B, 161 Gas Injector
62, 62A, 62B, 63, 63A, 63B, 64 Gas Supply Port
70A, 70B, 80, 90A, 90B Gas Supply Section
71A, 71B $AsH_3$/He Gas Mixture Cylinder
72A, 72B He Gas Cylinder
73A, 73B, 81, 91A, 91B $O_2$/He Gas Mixture Cylinder
74A, 74B, 75A, 75B, 76A, 76B, 82, 92A, 92B MFC
77A, 77B, 83, 93A, 93B Gas Supply Line

The invention claimed is:

1. A method for fabricating a semiconductor device, comprising the steps of:
(a) forming a fin-semiconductor region on a substrate; and
(b) performing plasma doping on the fin-semiconductor region by using impurity-containing gas and oxygen-containing gas, thereby forming an impurity-doped region in at least side portions of the fin-semiconductor region,
wherein, at step (b), after the oxygen-containing gas is used to perform first plasma doping on the fin-semiconductor region, the impurity-containing gas is used to perform second plasma doping on the fin-semiconductor region, thereby forming the impurity-doped region in the side portions of the fin-semiconductor region.

2. The method of claim 1, wherein the first plasma doping and the second plasma doping are performed in the same chamber.

3. The method of claim 1, wherein the first plasma doping and the second plasma doping are performed in different chambers.

4. The method of claim 1, wherein the impurity-containing gas is $AsH_3$.

5. The method of claim 1, wherein the impurity-containing gas is diluted with dilution gas.

6. The method of claim 5, wherein the dilution gas is He.

7. The method of claim 1, wherein the oxygen-containing gas is at least one of $O_2$, $H_2O$, $N_2O$, or $CO_2$.

8. The method of claim 1, wherein the oxygen-containing gas is diluted with dilution gas.

9. The method of claim 8, wherein the dilution gas is He.

10. The method of claim 1, further comprising the step of:
after step (a) and before step (b), forming a gate electrode so as to cover part of the fin-semiconductor region adjacent to the impurity-doped region,
wherein the impurity-doped region is an extension region.

11. The method of claim 1, further comprising the steps of:
after step (a) and before step (b), forming a gate electrode so as to cover part of the fin-semiconductor region apart from the impurity-doped region, and forming an insulating sidewall-spacer so as to cover part of the fin-semiconductor region positioned between the impurity-doped region and the gate electrode and cover a side surface of the gate electrode,
wherein the impurity-doped region is a source/drain region.

12. The method of claim 1, further comprising the step of:
after step (b), performing activation heat treatment on the impurity-doped region.

13. A method for fabricating a semiconductor device, comprising the steps of:
(a) forming a fin-semiconductor region on a substrate; and
(b) performing plasma doping on the fin-semiconductor region by using impurity-containing gas and oxygen-containing gas, thereby forming an impurity-doped region in at least side portions of the fin-semiconductor region,
wherein, at step (b), after the impurity-doped region is formed in the side portions of the fin-semiconductor region by using the impurity-containing gas to perform first plasma doping on the fin-semiconductor region, the oxygen-containing gas is used to perform second plasma doping on the fin-semiconductor region.

14. The method of claim 13, wherein the first plasma doping and the second plasma doping are performed in the same chamber.

15. The method of claim 13, wherein the first plasma doping and the second plasma doping are performed in different chambers.

16. The method of claim 13, wherein the impurity-containing gas is $AsH_3$.

17. The method of claim 13, wherein the impurity-containing gas is diluted with dilution gas.

18. The method of claim 17, wherein the dilution gas is He.

19. The method of claim 13, wherein the oxygen-containing gas is at least one of $O_2$, $H_2O$, $N_2O$, or $CO_2$.

20. The method of claim 13, wherein the oxygen-containing gas is diluted with dilution gas.

21. The method of claim 20, wherein the dilution gas is He.

22. The method of claim 13, further comprising the step of:
after step (a) and before step (b), forming a gate electrode so as to cover part of the fin-semiconductor region adjacent to the impurity-doped region,
wherein the impurity-doped region is an extension region.

23. The method of claim 13, further comprising the steps of:
after step (a) and before step (b), forming a gate electrode so as to cover part of the fin-semiconductor region apart from the impurity-doped region, and forming an insulating sidewall-spacer so as to cover part of the fin-semiconductor region positioned between the impurity-doped region and the gate electrode and cover a side surface of the gate electrode,
wherein the impurity-doped region is a source/drain region.

24. The method of claim 13, further comprising the step of:
after step (b), performing activation heat treatment on the impurity-doped region.

\* \* \* \* \*